United States Patent
Lee et al.

(10) Patent No.: US 11,617,257 B2
(45) Date of Patent: Mar. 28, 2023

(54) PRINTED CIRCUIT BOARD FOR TRANSMITTING SIGNAL IN HIGH-FREQUENCY BAND AND ELECTRONIC DEVICE INCLUDING SAME

(71) Applicant: SAMSUNG ELECTRONICS CO., LTD., Suwon-si (KR)

(72) Inventors: Youngsun Lee, Suwon-si (KR); Eunseok Hong, Suwon-si (KR); Byeongkeol Kim, Suwon-si (KR); Jongmin Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 129 days.

(21) Appl. No.: 17/298,810

(22) PCT Filed: May 17, 2021

(86) PCT No.: PCT/KR2021/006125
§ 371 (c)(1),
(2) Date: Jun. 1, 2021

(87) PCT Pub. No.: WO2021/246682
PCT Pub. Date: Dec. 9, 2021

(65) Prior Publication Data
US 2022/0322522 A1 Oct. 6, 2022

(30) Foreign Application Priority Data

Jun. 2, 2020 (KR) .................. 10-2020-0066626

(51) Int. Cl.
*H05K 1/02* (2006.01)
*H05K 1/03* (2006.01)

(52) U.S. Cl.
CPC ......... *H05K 1/0242* (2013.01); *H05K 1/0245* (2013.01); *H05K 1/0393* (2013.01)

(58) Field of Classification Search
CPC ... H05K 1/0242; H05K 1/0245; H05K 1/0393
See application file for complete search history.

(56) References Cited

U.S. PATENT DOCUMENTS 6,603,376 B1 * 8/2003 Handforth ............... H01P 3/087
 333/4
6,888,427 B2 * 5/2005 Sinsheimer ............. H01P 3/081
 333/238

(Continued)

FOREIGN PATENT DOCUMENTS

JP 9-199816 7/1997
JP 2002-033556 1/2002

(Continued)

OTHER PUBLICATIONS

International Search Report dated Aug. 23, 2021 in corresponding International Application No. PCT/KR2021/006125.

(Continued)

*Primary Examiner* — Hoa C Nguyen
(74) *Attorney, Agent, or Firm* — Nixon & Vanderhye, P.C.

(57) ABSTRACT

Various embodiments of the disclosure relate to a printed circuit for transmitting a signal in a high-frequency band and an electronic device including the same. The printed circuit board may include a flexible circuit board configured to transmit a signal in a high-frequency band, and the flexible circuit board may include: first multiple layers including a power line configured to transmit power; and second multiple layers stacked in a first direction of the first multiple layers and including a first signal line and a second signal line configured to transmit a signal in the high-frequency band. The first multiple layers may include a first punched region in which at least a portion overlapping the first signal line and the second signal line is removed, the second multiple layers may include a second punched region in (Continued)

which at least a portion overlapping the power line is removed, and at least a portion of the second punched region and the first punched region overlap each other forming a slit penetrating the flexible circuit board in the first direction.

15 Claims, 16 Drawing Sheets

(56) References Cited

U.S. PATENT DOCUMENTS

| | | | | |
|---|---|---|---|---|
| 6,924,712 | B2* | 8/2005 | Tabatabai | H05K 1/024 |
| | | | | 333/4 |
| 7,183,491 | B2* | 2/2007 | Ishikawa | H05K 1/117 |
| | | | | 174/262 |
| 7,755,445 | B2* | 7/2010 | Dutta | H01P 3/084 |
| | | | | 333/1 |
| 7,889,031 | B2* | 2/2011 | Dutta | H01P 1/2005 |
| | | | | 333/236 |
| 7,975,378 | B1* | 7/2011 | Dutta | H05K 1/0253 |
| | | | | 29/830 |
| 8,319,113 | B2* | 11/2012 | Cases | H05K 1/024 |
| | | | | 174/258 |
| 11,121,301 | B1* | 9/2021 | Marshall | G06N 10/00 |
| 2009/0058567 | A1* | 3/2009 | Dutta | H01L 23/5383 |
| | | | | 333/238 |
| 2010/0096167 | A1 | 4/2010 | Choi et al. | |
| 2012/0067961 | A1 | 3/2012 | Mauricia | |
| 2012/0257354 | A1* | 10/2012 | Dede | H01L 23/473 |
| | | | | 361/689 |
| 2019/0230785 | A1 | 7/2019 | Kim et al. | |

FOREIGN PATENT DOCUMENTS

| | | |
|---|---|---|
| JP | 2002-118340 | 4/2002 |
| JP | 2002-176231 | 6/2002 |
| JP | 2002-344148 | 11/2002 |
| JP | 2010-103537 | 5/2010 |
| KR | 10-0789531 | 12/2007 |
| KR | 10-2013-0060327 | 6/2013 |
| KR | 10-1824644 | 2/2018 |
| KR | 10-1938106 | 1/2019 |

OTHER PUBLICATIONS

English translation of International Search Report and Written Opinion dated Aug. 23, 2021 in corresponding International Application No. PCT/KR2021/006125.

* cited by examiner

PRINTED CIRCUIT BOARD FOR TRANSMITTING SIGNAL IN HIGH-FREQUENCY BAND AND ELECTRONIC DEVICE INCLUDING SAME

This application is the U.S. national phase of International Application No. PCT/KR2021/006125 filed 17 May 2021 which designated the U.S. and claims priority to KR Patent Application No. 10-2020-0066626 filed 2 Jun. 2020, the entire contents of each of which are hereby incorporated by reference.

TECHNICAL FIELD

The disclosure relates to a printed circuit board for transmitting a signal of a high-frequency band and an electronic device including the same.

BACKGROUND ART

Efforts are underway to develop a 5G communication system or a pre-5G communication system to meet a growing demand for wireless data traffic after the commercialization of 4G communication systems.

In order to achieve high data rates, it is possible to implement a 5G communication system using various frequency bands. For example, a low-frequency band of 600 to 800 MHz, a mid-frequency band of 2.5 to 4.9 GHz, or a high-frequency band of 24 GHz or higher may be used.

DISCLOSURE OF INVENTION

Technical Problem

An electronic device implementing a 5G communication system may include a flexible circuit board that transmits a signal of a high-frequency band. The flexible circuit board may include at least one signal line that transmits a signal of a high-frequency band and a power line.

In the flexible circuit board, a conductive layer may include at least one signal line and a power line. The thickness of the conductive layer may be designed in consideration of impedance matching of signal lines. For example, in the flexible circuit board, the thickness of the power line is designed as the thickness of the signal lines, which may limit power transmission of the power line.

Embodiments of the disclosure provide a flexible circuit board capable of reducing resistance of a power line while maintaining impedance matching so as to transmit a signal of a high-frequency band, and an electronic device including the same.

Solution to Problem

According to an example embodiment of the disclosure, an electronic device may include a flexible circuit board configured to transmit a signal in a high-frequency band. The flexible circuit board may include: first multiple layers including a power line configured to transmit power; and second multiple layers stacked in a first direction of the first multiple layers and including a first signal line and a second signal line configured to transmit a signal in the high-frequency band. The first multiple layers may include a first punched region in which at least a portion overlapping the first signal line and the second signal line is removed, the second multiple layers may include a second punched region in which at least a portion overlapping the power line is removed, and at least a portion of the second punched region and the first punched region overlap each other forming a slit penetrating the flexible circuit board in the first direction.

According to an example embodiment of the disclosure, a flexible circuit board configured to transmit a signal in a high-frequency band may include: first multiple layers including a power line configured to transmit power; and second multiple layers stacked in a first direction of the first multiple layers and including a first signal line and a second signal line configured to transmit a signal in the high-frequency band. The first multiple layers may include a first punched region in which at least a portion overlapping the first signal line and the second signal line is removed, the second multiple layers may include a second punched region in which at least a portion overlapping the power line is removed, and at least a portion of the second punched region and the first punched region overlap each other forming a slit penetrating the flexible circuit board in the first direction.

Advantageous Effects of Invention

With the flexible circuit board according to various example embodiments of the disclosure, high-power transmission is enabled by increasing the thickness of the power line while maintaining impedance matching of signal lines.

With the flexible circuit board according to various example embodiments of the disclosure, it is possible to facilitate a design for low heat generation due to a decrease in DC resistance of the power line.

With the flexible circuit board according to various example embodiments of the disclosure, it is possible to design the lines of the signal lines and the thickness of the power line have different thicknesses. Thus, it is easy to reduce the thickness of the signal lines, and it is possible to manufacture the flexible circuit board in a thin shape.

BRIEF DESCRIPTION OF DRAWINGS

The above and other aspects, features and advantages of certain embodiments of the present disclosure will be more apparent from the following detailed description, taken in conjunction with the accompanying drawings, in which.

MODE FOR THE INVENTION

Figure 1:
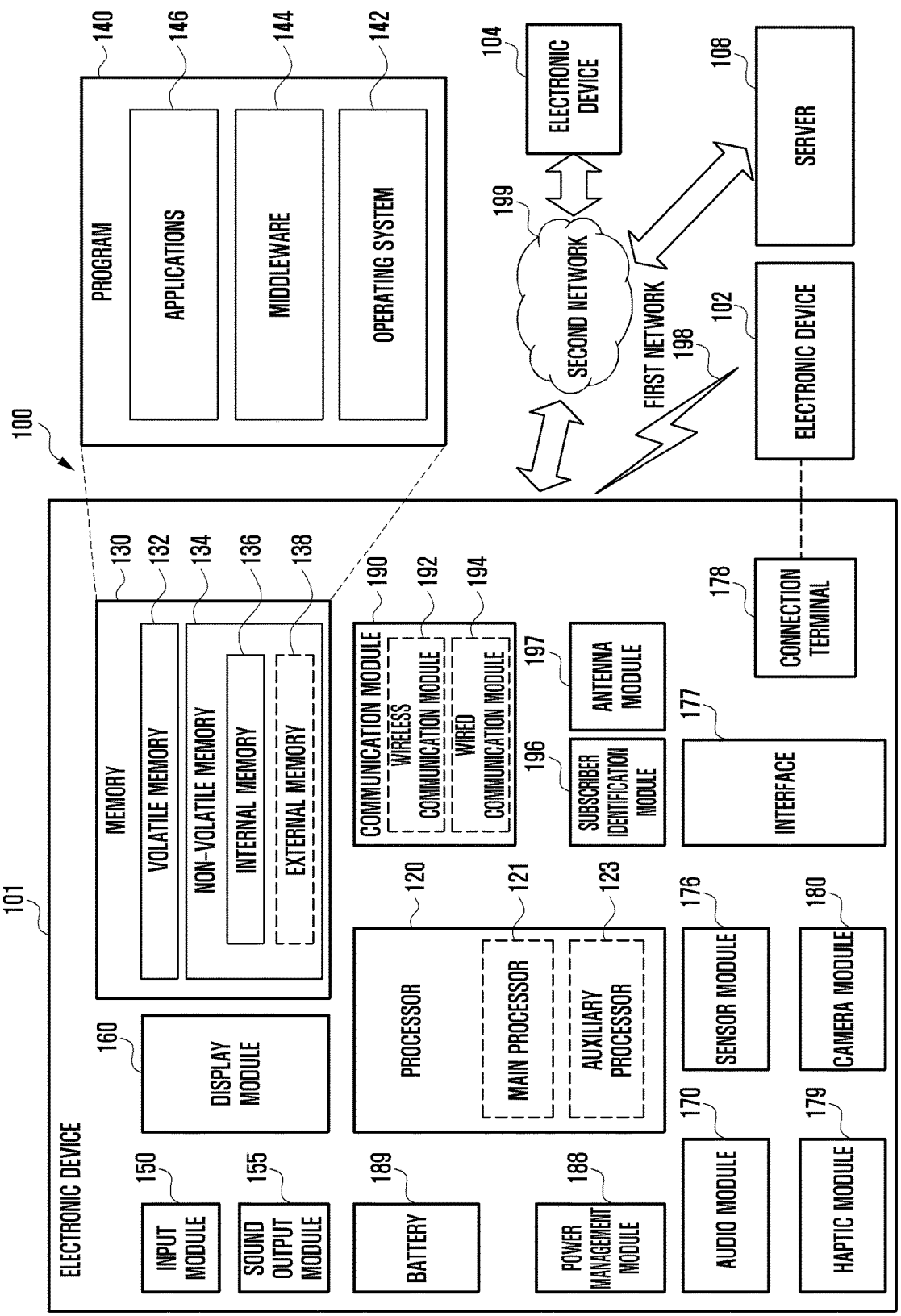
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
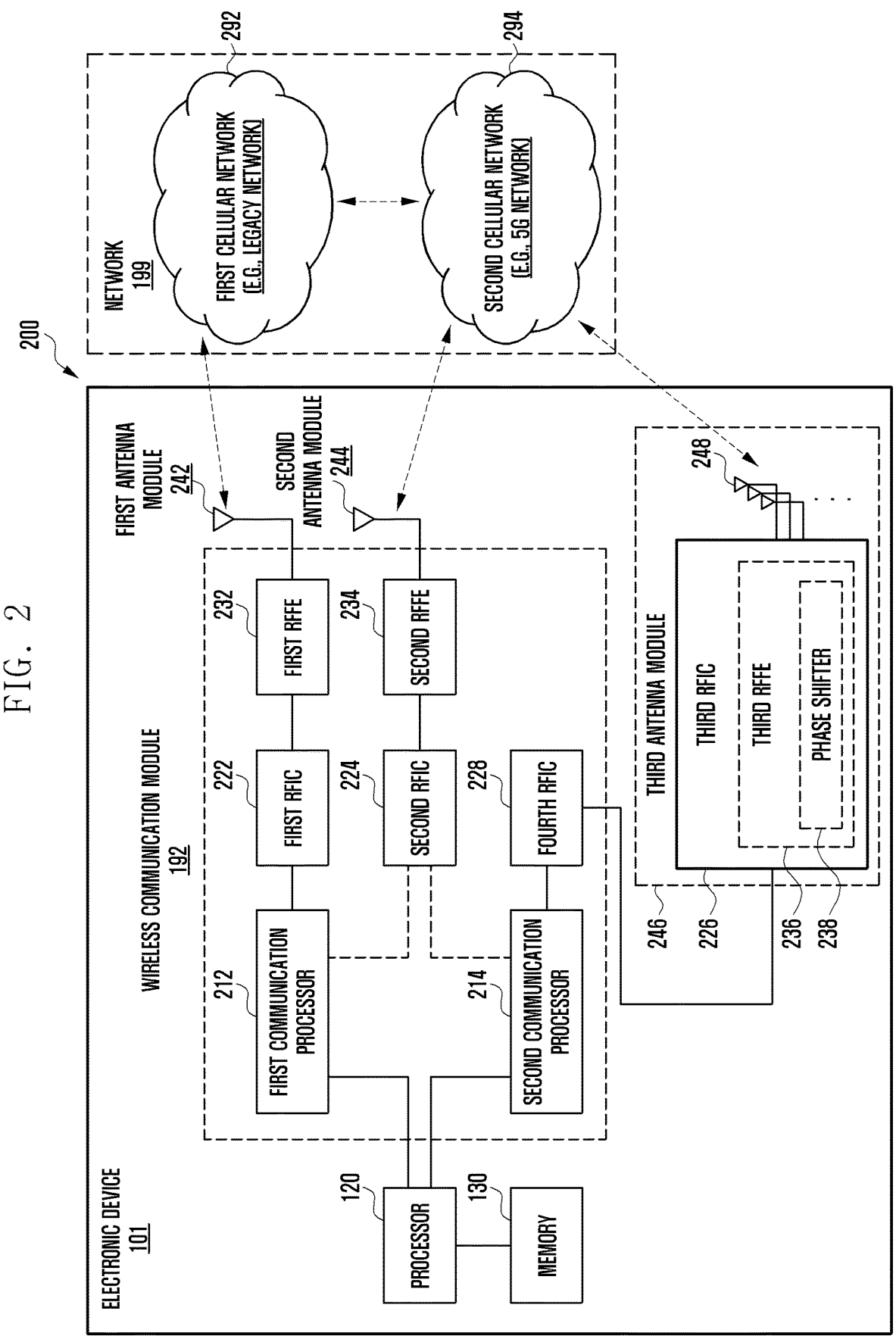
FIG. 2 is a block diagram illustrating an example electronic device configured to support legacy network communication and 5G network communication according to various embodiments.

FIG. 2 is a block diagram illustrating an electronic device 101 for supporting legacy network communication and 5G network communication according to various embodiments. Referring to FIG. 2, the electronic device 101 may include a first communication processor 212, a second communication processor 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may further include a processor 120 and a memory 130. The network 199 may include a first network 292 and a second network 294. According to an embodiment, the electronic device 101 may further include at least one component among the components illustrated in FIG. 1, and the network 199 may further include at least one different network. According to an embodiment, the first communication processor 212, the second communication processor 214, the first RFIC 222, the second RFIC 224, the fourth RFIC 228, the first RFFE 232, and the second RFFE 234 may form at least a part of the wireless communication module 192. According to an embodiment, the fourth RFIC 228 may be omitted or included as a part of the third RFIC 226.

The first communication processor 212 may support establishment of a communication channel in a band to be used for wireless communication with the first network 292, and legacy network communication through the established communication channel. According to various embodiments, the first network may be a legacy network including a 2G, 3G, 4G, or long term evolution (LTE) network. The second communication processor 214 may support establishment of a communication channel corresponding to a designated band (for example, about 6 GHz to about 60 GHz) among bands to be used for wireless communication with the second network 294, and 5G network communication through the established communication channel. According to various embodiments, the second network 294 may be a 5G network defined by third generation partnership project (3GPP). Additionally, according to an embodiment, the first communication processor 212 or the second communication processor 214 may support establishment of a communication channel corresponding to another designated band (for example, about 6 GHz or lower) among the bands to be used for wireless communication with the second network 294, and 5G network communication through the established communication channel. According to an embodiment, the first communication processor 212 and the second communication processor 214 may be implemented inside a single chip or a single package. According to various embodiments, the first communication processor 212 or the second communication processor 214 may be formed inside a single chip or a single package together with a processor 120, an auxiliary processor 123, or a communication module 190.

The first RFIC 222 may convert a baseband signal generated by the first communication processor 212 into a radio frequency (RF) signal at about 700 MHz to about 3 GHz, which is used for the first network 292 (for example, legacy network), during transmission. During reception, an RF signal may be acquired from the first network 292 (for example, legacy network) through an antenna (for example, the first antenna module 242), and may be preprocessed through an RFFE (for example, the first RFFE 232). The first RFIC 222 may convert the preprocessed RF signal into a baseband signal such that the same can be processed by the first communication processor 212.

The second RFIC 224 may convert a baseband signal generated by the first communication processor 212 or the second communication processor 214 into an RF signal in a Sub6 band (for example, about 6 GHz or lower) (hereinafter, referred to as a 5G Sub6 RF signal) that is used for the second network 294 (for example, 5G network). During reception, a 5G Sub6 RF signal may be acquired from the second network 294 (for example, 5G network) through an antenna (for example, the second antenna module 244), and may be preprocessed through an RFFE (for example, the second RFFE 234). The second RFIC 224 may convert the preprocessed 5G Sub6 RF signal into a baseband signal such that the same can be processed by a communication processor corresponding to the first communication processor 212 or the second communication processor 214.

The third RFIC 226 may convert a baseband signal generated by the second communication processor 214 into an RF signal in a 5G Above6 band (for example, about 6 GHz to about 60 GHz) (hereinafter, referred to as a 5G Above6 signal) that is to be used for the second network 294 (for example, 5G network). During reception, a 5G Above6 RF signal may be acquired from the second network 294 (for example, 5G network) through an antenna (for example, the antenna 248), and may be preprocessed through the third RFFE 236. The third RFIC 226 may convert the preprocessed 5G Above6 signal into a baseband signal such that the same can be processed by the second communication processor 214. According to an embodiment, the third RFFE 236 may be formed as a part of the third RFIC 226.

According to an embodiment, the electronic device 101 may include a fourth RFIC 228 separately from the third RFIC 226 or as at least a part thereof. In this case, the fourth RFIC 228 may convert a baseband signal generated by the second communication processor 214 into an RF signal in an intermediate frequency band (for example, about 9 GHz to about 11 GHz) (hereinafter, referred to as an IF signal) and then deliver the IF signal to the third RFIC 226. The third RFIC 226 may convert the IF signal into a 5G Above6 RF signal. During reception, a 5G Above6 RF signal may be received from the second network 294 (for example, 5G network) through an antenna (for example, antenna 248) and converted into an IF signal by the third RFIC 226. The fourth RFIC 228 may convert the IF signal into a baseband signal such that the same can be processed by the second communication processor 214.

According to an embodiment, the first RIFC 222 and the second RFIC 224 may be implemented as at least a part of a single chip or a single package. According to an embodiment, the first RFFE 232 and the second RFFE 234 may be implemented as at least a part of a single chip or a single package. According to an embodiment, at least one antenna module of the first antenna module 242 or the second antenna module 244 may be omitted or coupled to another antenna module so as to process RF signal in multiple corresponding bands.

According to an embodiment, the third RFIC 226 and the antenna 248 may be arranged on the same substrate so as to form a third antenna module 246. For example, the wireless communication module 192 or the processor 120 may be arranged on a first substrate (for example, main PCB). In this case, the third RFIC 226 may be formed on a partial area (for example, lower surface) of a second substrate (for example, sub PCB) that is separate from the first substrate, and the antenna 248 may be arranged in another partial area (for example, upper surface), thereby forming a third antenna module 246. The third RFIC 226 and the antenna 248 may be arranged on the same substrate such that the length of the transmission line between the same can be reduced. This may reduce loss (for example, attenuation) of a signal in a high-frequency band (for example, about 6 GHz to about 60 GHz) used for 5G network communication, for example, due to the transmission line. Accordingly, the electronic device 101 may improve the quality or speed of communication with the second network 294 (for example, 5G network).

According to an embodiment, the antenna 248 may be formed as an antenna array including multiple antenna elements that may be used for beamforming. In this case, the third RFIC 226 may include multiple phase shifters 238 corresponding to the multiple antenna elements, as a part of the third RFFE 236, for example. During transmission, each of the multiple phase shifters 238 may shift the phase of a 5G Above6 RF signal, which is to be transmitted to the outside (for example, base station of 5G network) of the electronic device 101, through a corresponding antenna element. During reception, each of the multiple phase shifters 238 may shift the phase of a 5G Above6 RF signal received from the outside into the same or substantially same phase through a corresponding antenna element. This enables transmission or reception through beamforming between the electronic device 101 and the outside.

The second network 294 (for example, 5G network) may be operated independently of the first network 292 (for example, legacy network) (for example, standalone (SA)), or operated while being connected thereto (for example, non-standalone (NSA)). For example, the 5G network may include only an access network (for example, 5G radio access network (RAN) or next-generation network (NG RAN)) and include no core network (for example, next-generation core (NGC)). In this case, the electronic device 101 may access the access network of the 5G network and then access an external network (for example, Internet) under the control of the core network (for example, evolved packed core (EPC)) of the legacy network. Protocol information (for example, LTE protocol network) for communication with the legacy network or protocol information (for example, new radio (NR) protocol information) for communication with the 5G network may be stored in the memory 230, and may be accessed by another component (for example, the processor 120, the first communication processor 212, or the second communication processor 214).

Figure 3:
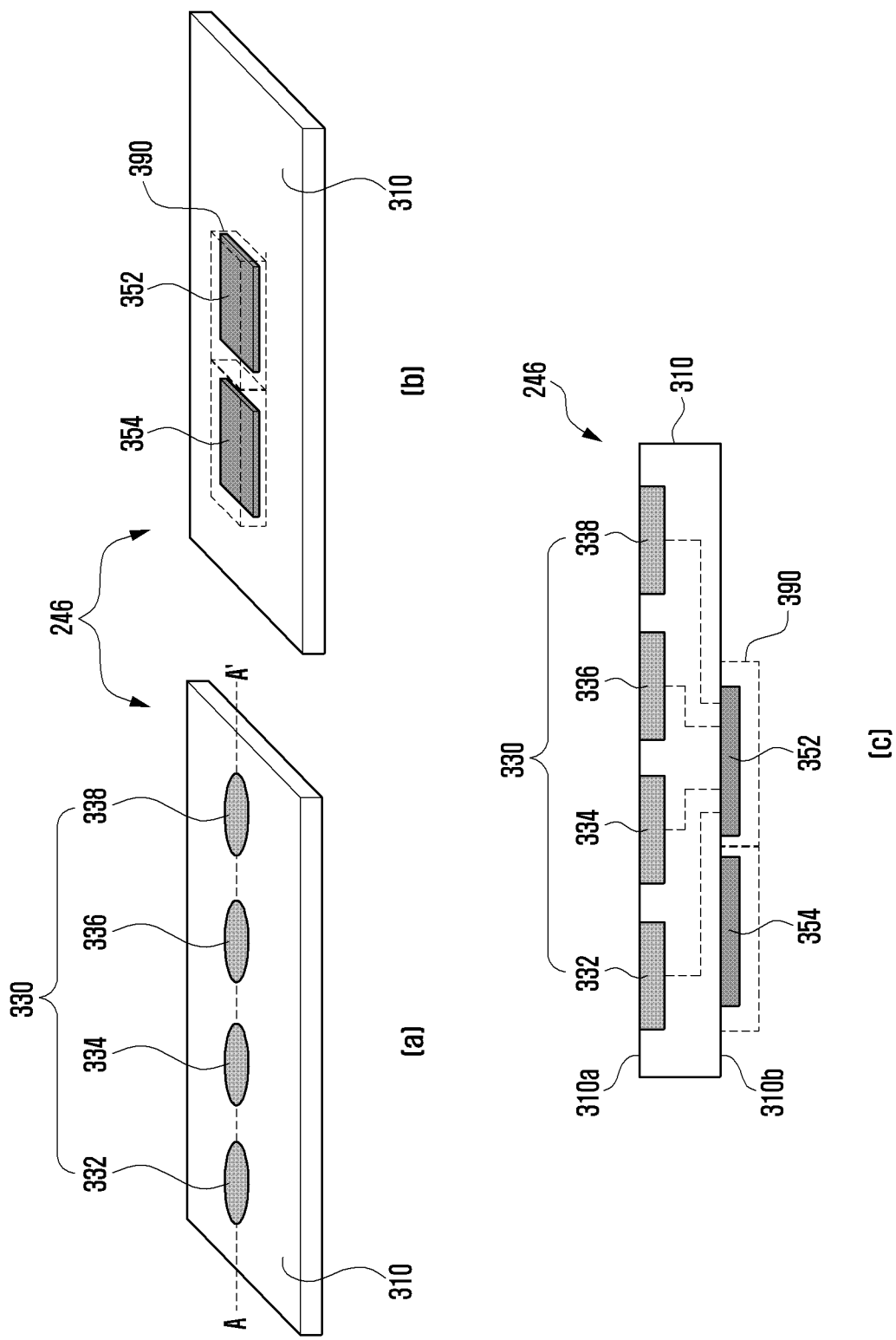
FIG. 3A is a perspective view of the third antenna module viewed from one side according to various embodiments.
FIG. 3B is a perspective view of the third antenna module viewed from an other side according to various embodiments.
FIG. 3C is a cross-sectional view of the third antenna module in taken along line A-A' according to various embodiments.

FIGS. 3A, 3B and 3C illustrate an example of the third antenna module 246 described with reference to FIG. 2. FIG. 3A is a perspective view of the third antenna module 246 viewed from one side, and FIG. 3B is a perspective view of the third antenna module 246 viewed from the other side. FIG. 3C is a cross-sectional view of the third antenna module 246 in taken along line A-A'.

Referring to FIGS. 3A, 3B and 3C, according to an embodiment, the third antenna module 246 may include a first printed circuit board 310, an antenna array 330, a radio-frequency integrated circuit (RFIC) 352, a power management integrated circuit (PMIC) 354, and a module interface (not illustrated). According to an embodiment, the third antenna module 246 may further include a shield member (e.g., including a shielding material) 390. In various embodiments, at least one of the above-mentioned components may be omitted, or at least two of the components may be integrally formed.

The first printed circuit board 310 may include a plurality of conductive layers and a plurality of non-conductive layers stacked alternately with the conductive layers. The first printed circuit board 310 may provide electrical connection between various electronic components disposed in the first printed circuit board 310 and/or outside the first printed circuit board 310 using wiring lines and conductive vias formed in the conductive layers.

The antenna array 330 (e.g., 248 in FIG. 2) may include a plurality of antenna elements 332, 334, 336, or 338 arranged to form directional beams. As illustrated, the antenna elements may be disposed on a first surface 310a of the first printed circuit board 310. According to an embodiment, the antenna array 330 may be disposed inside the first printed circuit board 310. According to various embodiments, the antenna array 330 may include a plurality of antenna arrays, which are different or the same in shape or type (e.g., a dipole antenna array and/or a patch antenna array).

The RFIC 352 (e.g., 226 in FIG. 2) may be disposed in another region of the first printed circuit board 310 (e.g., a second surface 310b opposite to the first side surface 310a) spaced apart from the antenna array. The RFIC may be configured to be capable of processing signals in a selected frequency band transmitted/received through the antenna array 330. According to an embodiment, during transmission, the RFIC 352 may convert a baseband RF signal acquired from a communication processor (e.g., the second communication processor 214 in FIG. 2) into an RF signal in a designated band. During reception, the RFIC 352 may convert an RF signal received through the antenna array 330 into a baseband signal, and may transmit the baseband signal to a communication processor.

According to an embodiment, during transmission, the RFIC 352 may up-convert an IF signal (e.g., about 9 GHz to about 11 GHz) acquired from an intermediate frequency integrated circuit (IFIC) (e.g., the fourth RFIC 228 in FIG. 2) into an RF signal of a selected band. During reception, the RFIC 352 may down-convert an RF signal acquired through the antenna array 330 into an IF signal and transmit the IF signal to the IFIC.

The PMIC 354 may be arranged in another partial region (e.g., the second surface 310b) of the first printed circuit board 310 spaced apart from the antenna array 330. The PMIC 354 may receive a voltage from a main printed circuit board (e.g., the second printed circuit board 430 in FIG. 4), and may provide required power for various components (e.g., the RFIC 352) on the antenna module.

The shield member 390 may be arranged on a portion (e.g., the second surface 310b) of the first printed circuit board 310 so as to electromagnetically shield at least one of the RFIC 352 or the PMIC 354. According to an embodiment, the shield member 390 may include a shield can.

Although not illustrated, in various embodiments, the third antenna module 246 may be electrically connected to another printed circuit board (e.g., the second printed circuit board 430 in FIG. 4) via a module interface. The module interface may include a connecting member, such as a coaxial cable connector, a board-to-board connector, an interposer, or a flexible printed circuit board (FPCB). Through the connecting member, the RFIC 352 and/or the PMIC 354 of the antenna module may be electrically connected to the main printed circuit board (e.g., the second printed circuit board 430 in FIG. 4).

In various embodiments, the electronic device (e.g., the electronic device 101 in FIG. 1) may include an single third antenna module 246 or a plurality of third antenna modules 246.

An electronic device according to various example embodiments of the disclosure (e.g., the electronic device 101 in FIG. 1) may include: a flexible circuit board (e.g., the flexible circuit board 410 in FIG. 5) configured to transmit a signal in a high-frequency band. The flexible circuit board may include first multiple layers (e.g., the first multiple layers 510 in FIG. 5) including a power line (e.g., the power line 5121 in FIG. 5) configured to transmit power, and second multiple layers stacked in a first direction of the first multiple layers and including a first signal line (e.g., the first signal line 5221 in FIG. 5) and a second signal line (e.g., the second signal line 5222 in FIG. 5) configured to transmit a signal in the high-frequency band, the first multiple layers may include a first punched region (e.g., the first punched region 631 in FIG. 6C) in which at least a portion overlapping the first signal line and the second signal line is removed, the second multiple layers may include a second punched region (e.g., the second punched line 632 in FIG. 6C) in which at least a portion overlapping the power line is removed, and at least a portion of the second punched region and the first punched region overlap each other forming a slit (e.g., the first slit 531 or the second slit 532 in FIG. 6C) penetrating the flexible circuit board in the first direction.

According to various example embodiments of the disclosure, the first multiple layers may include: a first insulating layer; a first upper conductive layer disposed in the first direction from the first insulating layer and including the power line; and a first lower conductive layer disposed in a second direction opposite the first direction from the first insulating layer and including a first lower ground.

According to various example embodiments of the disclosure, the second multiple layers may include: a second insulating layer; a second upper conductive layer disposed in the first direction from the second insulating layer and including the first signal line and the second signal line; and a second lower conductive layer disposed in the second direction from the second insulating layer and including a second lower ground.

According to various example embodiments of the disclosure, a thickness of the first upper conductive layer may be greater than a thickness of the second upper conductive layer wherein a thickness of the power line is greater than the thicknesses of the first signal line and the second signal line.

According to various example embodiments of the disclosure, the thickness of the first lower conductive layer including the first lower ground may be greater than the thickness of the second lower conductive layer including the second lower ground.

According to various example embodiments of the disclosure, the thickness of the first insulating layer may be less than the thickness of the second insulating layer wherein an entire thickness of the first multiple layers is equal to an entire thickness of the second multiple layers.

According to various example embodiments of the disclosure, the second upper conductive layer may further include: a plurality of first ground patterns provided at intervals on opposite sides of the first signal line, and a plurality of second ground patterns provided at intervals on opposite sides of the second signal line.

According to various example embodiments of the disclosure, the second multiple layers may further include: a plurality of first vias penetrating the second insulating layer and electrically connecting the plurality of first ground patterns and the second lower ground; and a plurality of second vias penetrating the second insulating layer and electrically connecting the plurality of second ground patterns and the second lower ground.

According to various example embodiments of the disclosure, the second multiple layers may further include: a cover layer disposed in the first direction from the second upper conductive layer and covering the first signal line and the second signal line; and a shield film disposed in the first direction from the cover layer and electrically connected to the plurality of first ground patterns and the plurality of second ground patterns by the conductive member.

According to various example embodiments of the disclosure, the flexible circuit board may include a first surface facing the first direction and a second surface facing away from the first surface, and the slit may be provided between the power line and the first signal line and/or between the power line and the second signal line when the first surface is viewed from above.

According to various example embodiments of the disclosure, the power line may be disposed between the first signal line and the second signal line when the first surface is viewed from above.

According to various example embodiments of the disclosure, the second signal line may be disposed between the first signal line and the power line when the first surface is viewed from above.

According to various example embodiments of the disclosure, a flexible circuit board (e.g., the flexible circuit board 410 in FIG. 5) configured to transmit a signal in a high-frequency band may include: first multiple layers including a power line configured to transmit power; and second multiple layers stacked in a first direction of the first multiple layers and including a first signal line and a second signal line configured to transmit a signal in the high-frequency band. The first multiple layers may include a first punched region in which at least a portion overlapping the first signal line and the second signal line is removed, the second multiple layers may include a second punched region in which at least a portion overlapping the power line is removed, and at least a portion of the second punched region and the first punched region overlap each other forming a slit penetrating the flexible circuit board in the first direction.

According to various example embodiments of the disclosure, the first multiple layers may include: a first insulating layer; a first upper conductive layer disposed in the first direction from the first insulating layer and including the power line; and a first lower conductive layer disposed in a second direction opposite the first direction from the first insulating layer and including a first lower ground.

According to various example embodiments of the disclosure, the second multiple layers may include: a second insulating layer; a second upper conductive layer disposed in the first direction from the second insulating layer and including the first signal line and the second signal line; and a second lower conductive layer disposed in the second direction from the second insulating layer and including a second lower ground.

According to various example embodiments of the disclosure, a thickness of the first upper conductive layer may be greater than a thickness of the second upper conductive layer wherein a thickness of the power line is greater than the thicknesses of the first signal line and the second signal line.

According to various example embodiments of the disclosure, the thickness of the first lower conductive layer including the first lower ground may be greater than the thickness of the second lower conductive layer including the second lower ground.

According to various example embodiments of the disclosure, the thickness of the first insulating layer may be less than the thickness of the second insulating layer wherein an entire thickness of the first multiple layers is equal to an entire thickness of the second multiple layers.

According to various example embodiments of the disclosure, the second upper conductive layer may further include: a plurality of first ground patterns provided at intervals on opposite sides of the first signal line, and a plurality of second ground patterns provided at intervals on opposite sides of the second signal line.

According to various example embodiments of the disclosure, the second multiple layers may further include: a plurality of first vias penetrating the second insulating layer and electrically connecting the plurality of first ground patterns and the second lower ground; and a plurality of second vias penetrating the second insulating layer and electrically connecting the plurality of second ground patterns and the second lower ground.

Figure 4:
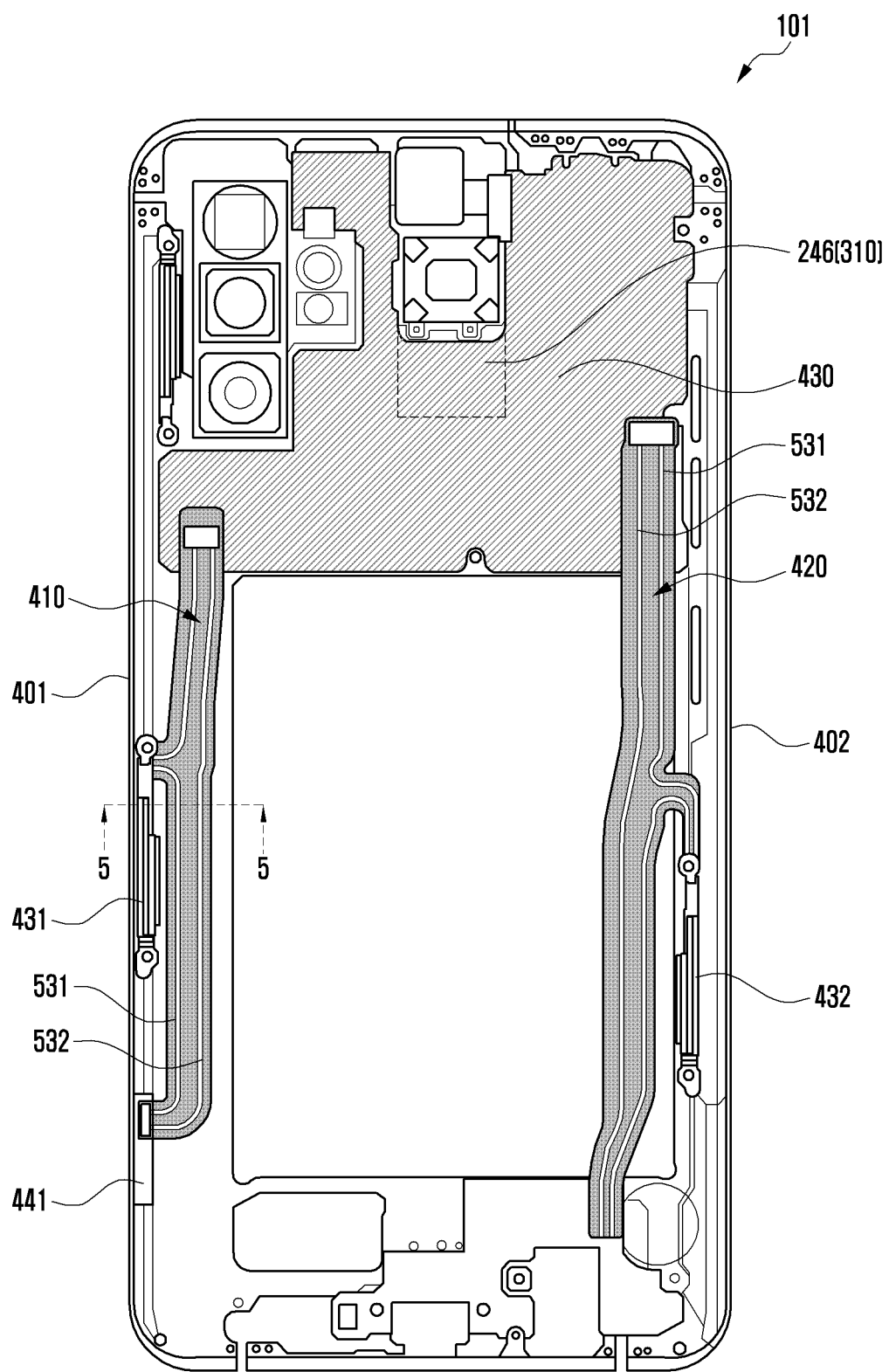
FIG. 4 is a diagram illustrating an example configuration of an electronic device including the structure of the third antenna module described with reference to FIG. 2 according to various embodiments.

FIG. 4 is a diagram illustrating an example configuration of an electronic device 101 including the structure of the third antenna module 246 described with reference to FIG. 2 according to various embodiments. The electronic device 101 illustrated in FIG. 4 may further include an embodiment in which the electronic device 101 may be at least partially similar to or different from the electronic device 101 of FIG. 1. FIG. 4 may be a view illustrating the state in which a rear cover (or a rear plate) (not illustrated) of the electronic device 101 is removed.

Referring to FIG. 4, 5G antenna modules may be disposed adjacent to a first side surface 401 of the electronic device 101 according to an embodiment. For example, the 5G antenna modules may include a first 5G module 431 configured to communicate with a 5G network (e.g., the second network 294 in FIG. 2), or a WiFi antenna module 441 configured to access a WiFi network based on 802.11ay. According to an embodiment, the first 5G module 431 may be the same as or at least partially similar to the third antenna module 246 illustrated in FIGS. 3A, 3B and 3C.

According to an embodiment, the first 5G antenna module 431 and/or the WiFi antenna module 441 disposed on the first side surface 401 of the electronic device 101 may be electrically connected to a second printed circuit board 430 (e.g., the second printed circuit board 430 in FIG. 4) via the first flexible circuit board 410.

According to an embodiment, the second printed circuit board 430 may be a main printed circuit board. According to an embodiment, at least a portion of the second printed circuit board 430 may be disposed adjacent to the third antenna module 246 illustrated in FIGS. 3A, 3B and 3C, and may be electrically connected to the third antenna module 246 via a connecting member (e.g., the connector (not illustrated)).

Figure 5:
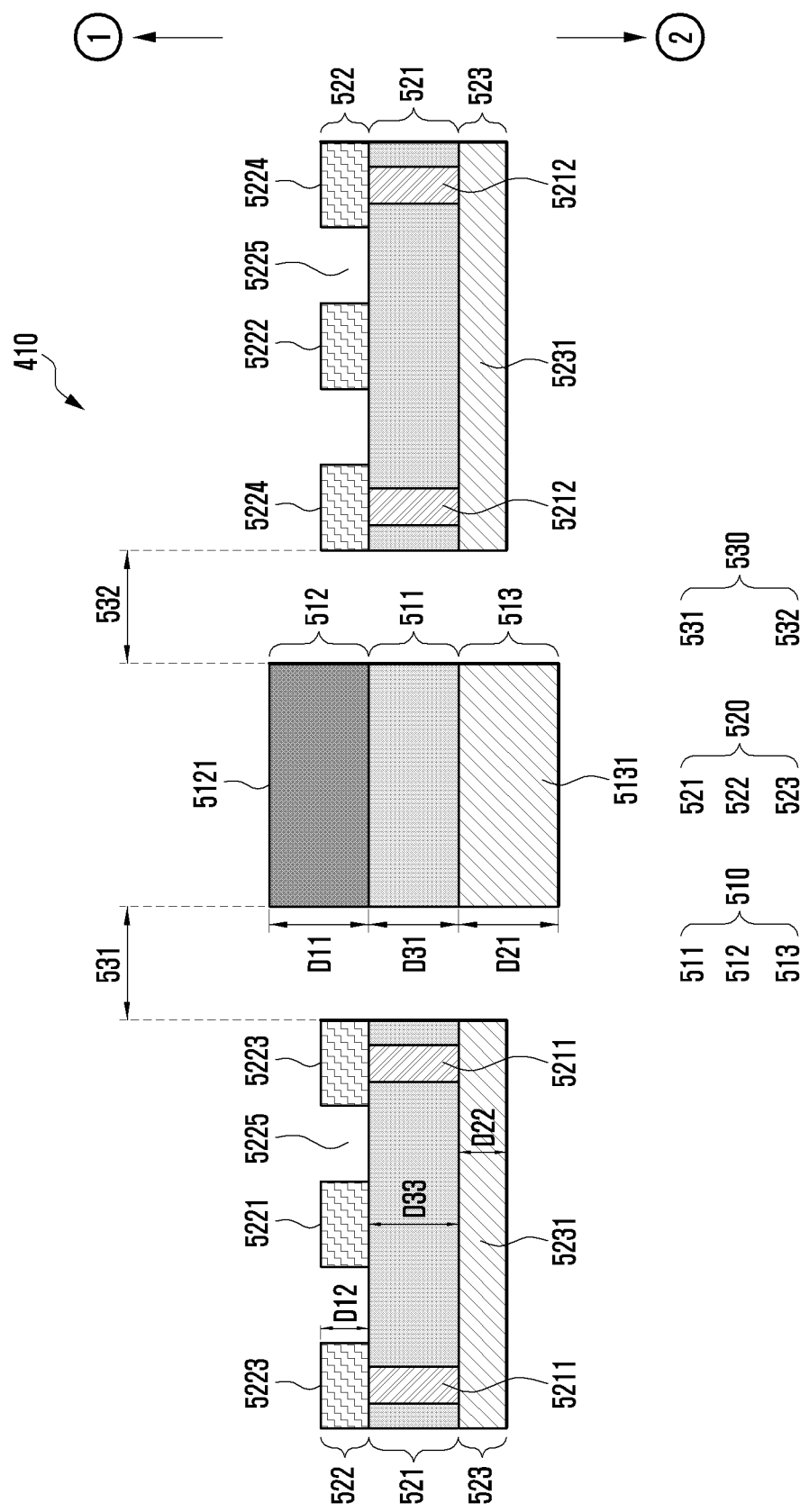
FIG. 5 is a cross-sectional view illustrating the flexible circuit board taken along line 5-5 in FIG. 4 according to various embodiments.

According to an embodiment, the first flexible circuit board 410 may include a plurality of signal lines (e.g., the first signal line 5221 and the second signal line 5222 in FIG. 5) configured to transmit a signal in a high-frequency band (e.g., 10 GHz to 100 GHz). According to an embodiment, the plurality of signal lines 5221 and 5222 may be transmission lines configured to transmit a signal in a high-frequency band (e.g., a band of an interface (IF) frequency of about 9 GHz to 10 GHz/RF radiation frequency of about 24 GHz to 28 GHz or 39 GHz).

According to an embodiment, the plurality of signal lines 5221 and 5222 may be a transmission line configured to transmit a signal in a high-frequency band (e.g., a band of an interface (IF) frequency of about 18 GHz/an RF emission frequency of an about 60 GHz band) based on 802.11ay.

According to an embodiment, the first flexible circuit board 410 may include at least one low-speed signal control wiring line (e.g., the low-speed control signal wiring line 5121 in FIG. 5) configured to transmit a low-speed control signal such as power (e.g., VBAT), a clock (e.g., CLK), or data (e.g., DATA). For example, the first multiple layers 510 may include a power line (e.g., the power line 5121 in FIG. 5), and may further include at least one low-speed control signal line (not illustrated) provided on a layer different from that of the power line.

According to an embodiment, one or more slits 531 and 532 may be formed on the first flexible circuit board 410. For example, the first flexible circuit board 410 may include a first slit 531 and a second slit 532. According to an embodiment, the first slit 531 and the second slit 532 may be formed by removing at least a portion of the first flexible circuit board 410. According to an embodiment, the first slit 531 and the second slit 532 may be formed along the direction in which the first flexible circuit board 410 is formed (e.g., the length direction of the first flexible circuit board 410).

According to an embodiment, another 5G antenna module may be disposed adjacent to the second side surface 402 opposite to the first side surface 401 of the electronic device 101. For example, a second 5G module 432 configured to communicate with a 5G network (e.g., the second network 294 in FIG. 2) may be disposed on the second side surface 402 of the electronic device 101.

According to an embodiment, the second 5G module 432 may be electrically connected to the second printed circuit board 430 via the second flexible circuit board 420. In an embodiment, the second flexible circuit board 420 may include a structure that is the same as or similar to the first flexible circuit board 410. For example, the second flexible circuit board 420 may include a first slit 531 and a second slit 532 like the first flexible circuit board 410.

The second flexible circuit board 420 may include a plurality of signal lines 5221 and 5222 configured to transmit a signal in a high-frequency band (e.g., 10 GHz to 100 GHz). The second 5G module 432 may be the same as or at least partially similar to the third antenna module 246 illustrated in FIGS. 3A, 3B and 3C. In various embodiments, the second flexible circuit board 420 may further include at least one low-speed signal wiring line 5121 configured to transmit a low-speed control signal such as power (e.g., VBAT), a clock (e.g., CLK), or data (e.g., DATA).

FIG. 5 is a cross-sectional view illustrating a cross section of the flexible circuit board 410 taken along line 5-5 in FIG. 4 according to various embodiments. For example, FIG. 5 may be a view illustrating a cross section obtained by cutting a portion of the first flexible circuit board 410 illustrated in FIG. 4.

Referring to FIG. 5, a flexible circuit board 410 according to an embodiment may include a power line 5121 configured to transmit power, and a first signal line 5221 and a second signal line 5222 configured to transmit a high-frequency band signal (e.g., 10 GHz to 100 GHz). According to various embodiments, the number of signal lines 5221 and 5222 and the number of power lines 5121 of the flexible circuit board 410 may be variously changed.

According to an embodiment, the first signal line 5221 and the second signal line 5222 may be formed on the same layer, and the first signal line 5221 (or the second signal line 5222) and the power line 5121 may be formed on different layers 510 and 520. For example, the power line 5121 may be formed in the first multiple layers 510 of the flexible circuit board 410, and the first signal line 5221 and the second signal line 5222 may be formed in the second multiple layers 520 of the flexible circuit board 410.

According to an embodiment, the flexible circuit board 410 may include first multiple layers 510 including the power line 5121, and second multiple layers 520 including the first signal line 5221 and the second signal line 5222. According to an embodiment, the second multiple layers 520 may be formed by being stacked in the first direction ① of the first multiple layers 510 (e.g., the upward direction in FIG. 5).

According to an embodiment, the second multiple layers 520 may be disposed substantially parallel to the first multiple layers 510.

According to an embodiment, the power line 5121 may be disposed between the first signal line 5221 and the second signal line 5222. For example, the first signal line 5221 may be disposed in one direction of the power line 5121 (e.g., the left direction in FIG. 5), and the second signal line 5222 may be disposed in the other direction of the power line 5121 (e.g., the right direction in FIG. 5).

According to an embodiment, slits 530 may be formed between the first signal line 5221 and the second signal line 5222 and the power line 5121. For example, a first slit 531 may be formed between the first signal line 5221 and the power line 5121, and a second slit 532 may be formed between the second signal line 5222 and the power line 5121. According to an embodiment, the first slit 531 and the second slit 532 may be formed by removing a portion of the first multiple layers 510 and a portion of the second multiple layers 520 overlapping therewith. For example, the first slit 531 and the second slit 532 may be formed to at least partially penetrate boundary portions between the first signal line 5221 and the second signal line 5222 and the power line 5121 in the flexible circuit board 410.

According to an embodiment, the first slit 531 and the second slit 532 may be formed through a punching process of removing a portion of the first multiple layers 510 and a punching process of removing a portion of the second multiple layers 520. The punching processes will be described in greater detail below with reference to FIGS. 6A, 6B, 6C and 6D.

Hereinafter, the stacked structure of the flexible circuit board 410 according to an embodiment will be described in greater detail.

According to an embodiment, the first multiple layers 510 may include a first insulating layer 511, a first upper conductive layer 512 formed in the first direction ① from the first insulating layer 511, and a first lower conductive layer 513 formed in the second direction ② opposite to the first direction ① from the first insulating layer 511 (e.g., the downward direction in FIG. 5). According to an embodiment, the first upper conductive layer 512 may include a power line 5121. According to an embodiment, the first lower conductive layer 513 may include a first lower ground 5131.

According to an embodiment, the second multiple layers 520 may include a second insulating layer 521, a second upper conductive layer 522 formed in the first direction ①  from the second insulating layer 521, and a second lower conductive layer 523 formed in the second direction ② from the second insulating layer 521.

According to an embodiment, the second upper conductive layer 522 may include a first signal line 5221 and a second signal line 5222.

According to an embodiment, the second upper conductive layer 522 may further include first ground patterns 5223 spaced apart from the first signal line 5221 and disposed on opposite sides of the first signal line 5221. For example, a plurality of first ground patterns 5223 may be formed at intervals on opposite sides of the first signal line 5221.

According to an embodiment, the second upper conductive layer 522 may further include second ground patterns 5224 spaced apart from the second signal line 5222 and disposed on opposite sides of the second signal line 5222. For example, a plurality of second ground patterns 5224 may be formed at intervals on opposite sides of the second signal line 5222.

According to an embodiment, in the second upper conductive layer 522, an insulating material (e.g., cover layers (e.g., the cover layers 1112 in FIG. 11)) may be formed in a region 5225 between the first signal line 5221 and the first ground pattern 5223 and a region 5225 between the second signal line 5222 and the second ground pattern 5224.

According to an embodiment, the second lower conductive layer 523 may include a second lower ground 5231. According to an embodiment, the second lower ground 5231 may be electrically connected to the first ground pattern 5223 and the second ground pattern 5224 through vias penetrating through the second insulating layer 521. For example, the second multiple layers 520 may include a plurality of first vias 5211 penetrating the second insulating layer 521 and electrically connecting the plurality of first ground patterns 5223 and the second lower ground 5231 to each other, and a plurality of second vias 5212 penetrating the second insulating layer 521 and electrically connecting the plurality of second ground patterns 5224 and the second lower ground 5231 to each other.

According to an embodiment, the thickness of the first multiple layers 510 may be different from the thickness of the second multiple layers 520. For example, the thickness D31 of the first insulating layer 511 and the thickness D33 of the second insulating layer 521 may be different. For example, the thickness D11 of the first upper conductive layer 512 and the thickness D12 of the second upper conductive layer 522 may be different. For example, the thickness D21 of the first lower conductive layer 513 and the thickness D22 of the second lower conductive layer 523 may be different.

According to an embodiment, the thickness D21 of the first lower conductive layer 513 may be greater than the thickness D22 of the second lower conductive layer 523.

According to an embodiment, the thickness D11 of the first upper conductive layer 512 including the power line 5121 may be greater than the thickness D12 of the second upper conductive layer 522 including the first signal line 5221 and the second signal line 5222. For example, the thickness D11 of the power line 5121 may be greater than the thickness D12 of the first signal line 5221 and the second signal line 5222.

FIGS. 6A, 6B, 6C and 6D are cross-sectional views illustrating an example method of manufacturing a flexible circuit board 410 according to various embodiments. For example, FIGS. 6A, 6B, 6C and 6D (which may be referred to hereinafter as FIGS. 6A to 6D) may be cross-sectional views illustrating an example method of manufacturing the first flexible circuit board 410 illustrated in FIG. 5.

Figure 6A:
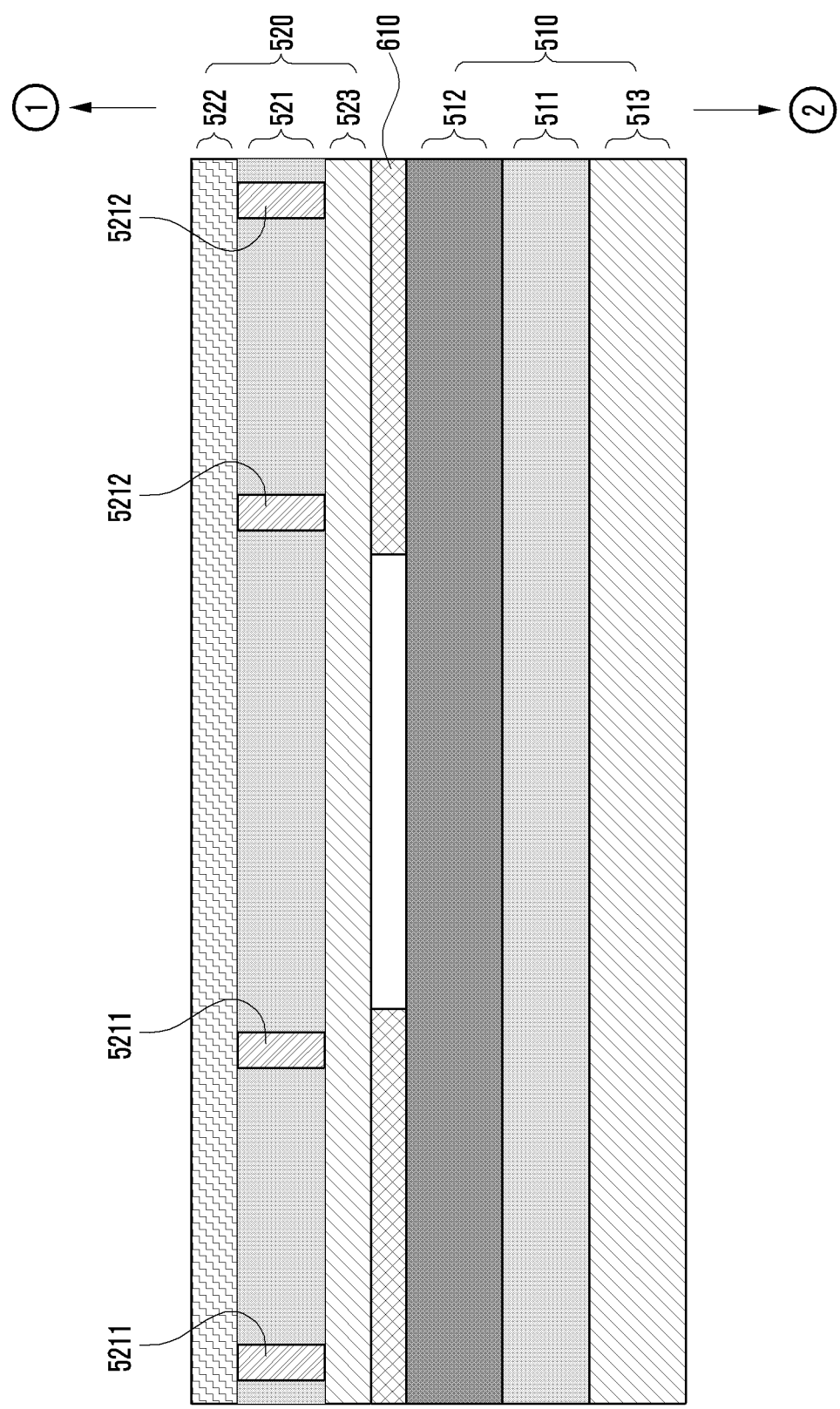
FIGS. 6A, 6B, 6C and 6D are cross-sectional views illustrating an example method of manufacturing a flexible circuit board according to various embodiments.

Referring to FIG. 6A, a method of manufacturing a flexible circuit board 410 according to an embodiment may include a first process of providing a flexible circuit board 410 including first multiple layers 510 and second multiple layers 520 stacked in a first direction ① from the first multiple layers 510. According to an embodiment, the first process may be a process of bonding (or attaching) the first multiple layers 510 to the second multiple layers 520. For example, at least a portion of the first multiple layers 510 (e.g., an edge area (or a corner area) of the first multiple layers 510) may be bonded to the second multiple layers 520 via an adhesive member 610.

According to an embodiment, the adhesive member 610 may include one or more of epoxy resin, acrylic resin, polyimide resin, and/or nitrile-butadien rubber.

According to an embodiment, in the first process, the first multiple layers 510 may include a first insulating layer 511, a first upper conductive layer 512 formed in the first direction ① from the first insulating layer 511, and a first lower conductive layer 513 formed in the second direction ② opposite to the first direction ① from the first insulating layer 511.

According to an embodiment, in the first process, the second multiple layers 520 may include a second insulating layer 521, a second upper conductive layer 522 formed in the first direction ① from the second insulating layer 521, and a second lower conductive layer 523 formed in the second direction ② from the second insulating layer 521.

According to an embodiment, before the first process, there may be a via process of forming a plurality of first vias 5211 and a plurality of second vias 5212 electrically connecting at least a portion of the second upper conductive layer 522 to the second lower conductive layer 523.

Figure 6B:
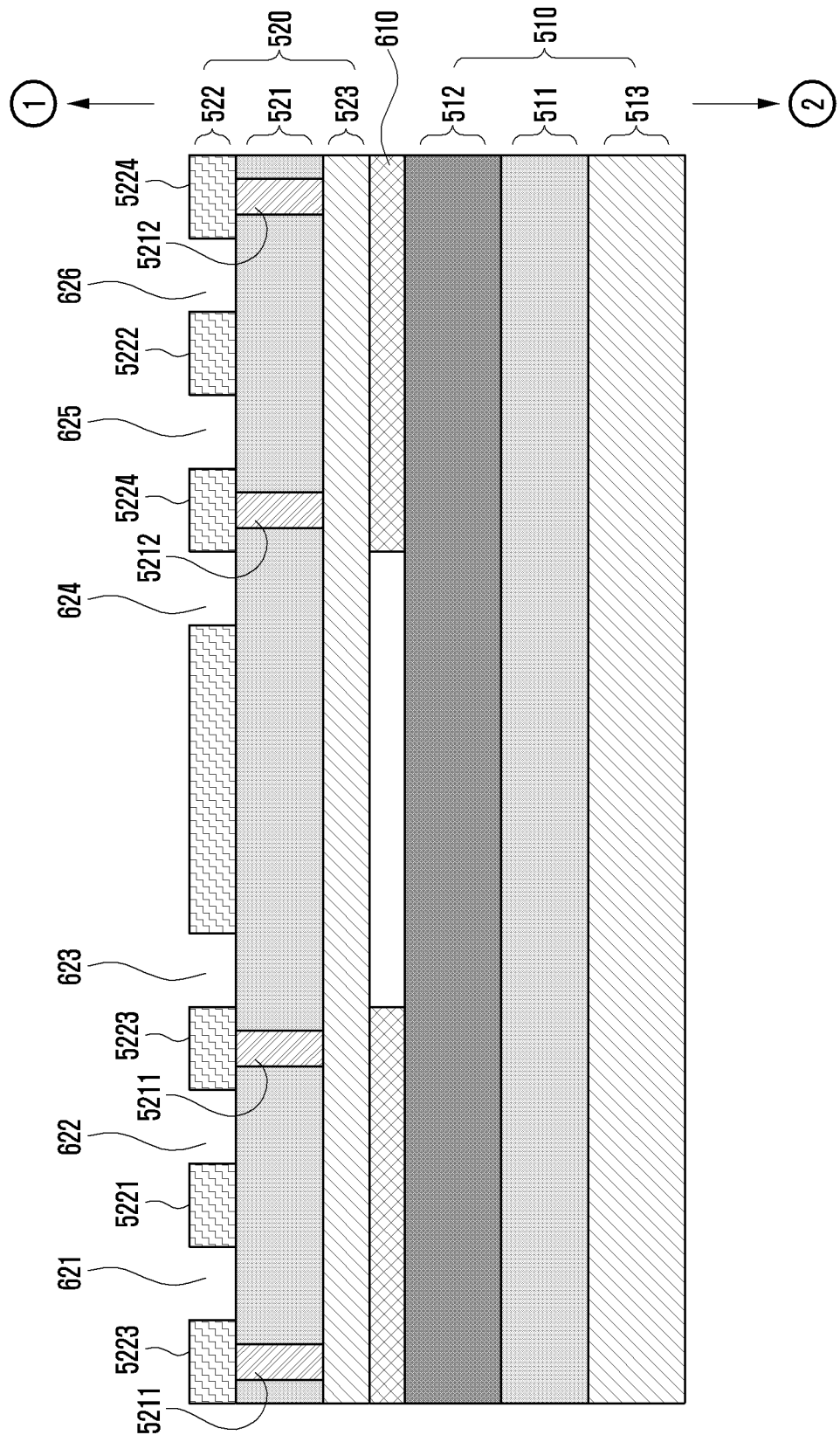

Referring to FIG. 6B, the method of manufacturing the flexible circuit board 410 according to an embodiment may include a second process of forming a first signal line 5221, a second signal line 5222, and a first ground pattern 5223, or a second ground pattern 5224 by patterning (e.g., etching) at least a portion of the second upper conductive layer 522. For example, the second process may include a process of patterning peripheral portions 621, 622, and 623 of the first signal line 5221 and the first ground pattern 5223 and peripheral portions 624, 625, and 626 of the second signal line 5222 and the second ground pattern 5224 in the second upper conductive layer 522.

Figure 6C:
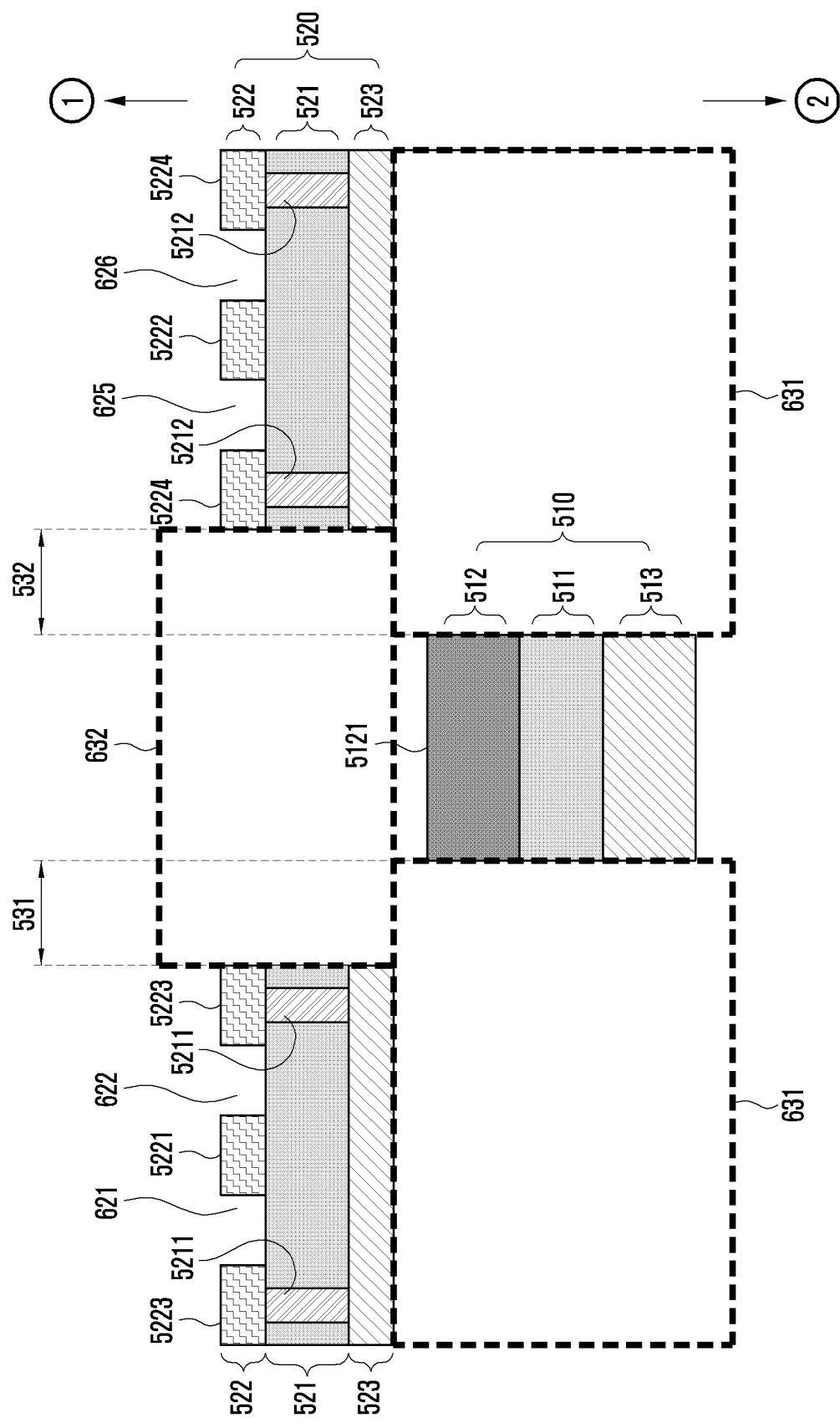

Referring to FIG. 6C, the method of manufacturing the flexible circuit board 410 according to an embodiment may include a third process of removing at least a portion of the first multiple layers 510 and at least a portion of the second multiple layers 520. According to an embodiment, the third process may include a first punching process of removing at least a portion of the first multiple layers 510, and a second punching process of removing at least a portion of the second multiple layers 520.

According to an embodiment, in the first punching process, at least a portion that overlaps the first signal line 5221 and the second signal line 5222 may be removed from the first multiple layers 510. According to an embodiment, portions of the first multiple layers 510 overlapping the first signal line 5221 and the second signal line 5222 and designated regions (e.g., at least some regions corresponding to the slits 531 and 532 (hereinafter, referred to as "slit regions")) may be defined as first punched regions 631, and the portions defined as the first punched regions 631 may be removed through a first punching process. For example, the first punched regions 631 may be regions of the first multiple layers 510 overlapping the first signal line 5221 and the second signal line 5222 and designated regions (e.g., the regions of the slits 531 and 532), and may be regions removed through the first punching process.

According to an embodiment, in the first punching process, the remaining portions except for the portion of the first multiple layers 510 in which the power line 5121 is formed and a portion of the flexible circuit board 410 connected to a connector (not illustrated) (e.g., the portions overlapping the first signal line 5221 and the second signal line 5222) may be removed.

According to an embodiment, in the second punching process, at least a portion overlapping the power line 5121 may be removed. According to an embodiment, the portions of the second multiple layers 520 overlapping the power line 5121 and designated regions (e.g., at least some regions corresponding to the slits 531 and 532 (hereinafter, referred to as "slit regions")) may be defined as second punched regions 632, and the portions defined as the second punched regions 632 may be removed through a second punching process. For example, the second punched regions 632 may be regions of the second multiple layers 520 overlapping the power line 5121 and designated regions (e.g., the regions of the slits 531 and 532), and may be regions removed through the second punching process.

According to an embodiment, through the second multiple layers 520, the portions other than the portions in which the first signal line 5221, the first ground pattern 5223, the second signal line 5222, and the second ground pattern 5224 are formed and the portion of the flexible circuit board 410 to be connected to a connector (not illustrated) (e.g., a portion overlapping the power line 5121) may be removed from the second multiple layers 520.

According to an embodiment, at least a part of the second punched regions 632 and the first punched regions 631 overlap each other, and thus the slits 531 and 532 may be formed. For example, the portions of the second punching regions 632 overlapping the first punching regions 631 may form the slits 531 and 532 that at least partially penetrate the flexible circuit board 410 in the first direction ① or the second direction ②. According to an embodiment, the slits 531 and 532 may include a first slit 531 penetrating the flexible circuit board 410 between the first signal line 5221 and the power line 5121 and a second slit 532 at least partially penetrating the flexible circuit board 410 between the second signal line 5222 and the power line 5121.

Figure 6D:
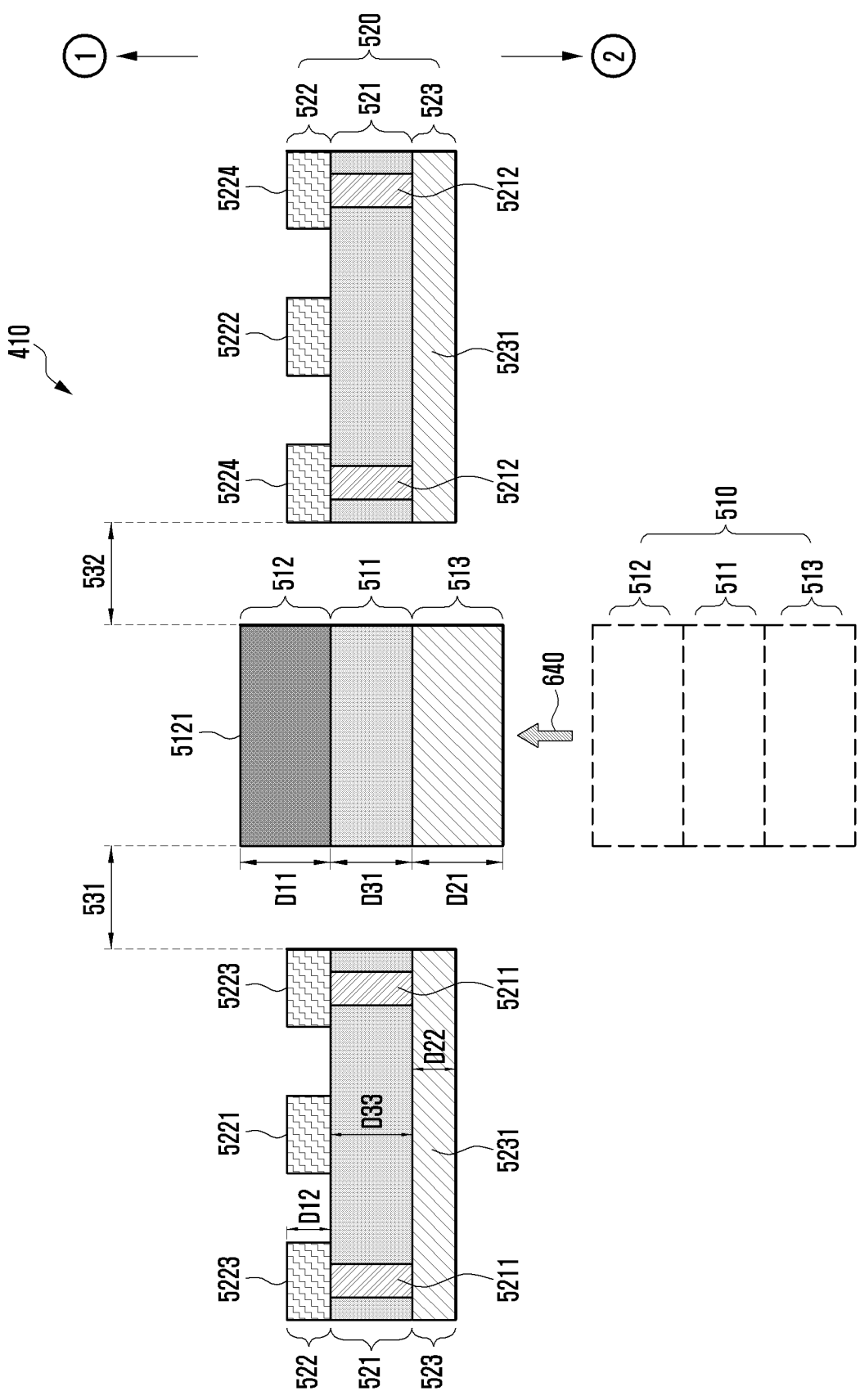

Referring to FIG. 6D, the method of manufacturing the flexible circuit board 410 according to an embodiment may be completed by disposing the portion in which the power line 5121 is formed in the first multiple layers 510 in the second punched region (e.g., the second punched region 632 of FIG. 6C) of the second multiple layers 520. For example, since the flexible circuit board 410 is very thin and has a flexible characteristic, the portion where the power line 5121 is formed is movable in the first direction ① as indicated by the arrow 640 in FIG. 6D. Accordingly, in the finally completed flexible circuit board 410, the power line 5121, the first signal line 5221 and/or the second signal line 5222 may be disposed substantially parallel to each other.

According to an embodiment, a portion of the flexible circuit board 410 to be connected to a connector (not illustrated) may not be removed through the process of punching the second punched region 632 of the second multiple layers 520. For example, in the portion of the flexible circuit board 410 to be connected to a connector (not illustrated), the portion in which the power line 5121 of the first multiple layers 510 is formed in the second punched region 632 may not be disposed.

Figure 7:
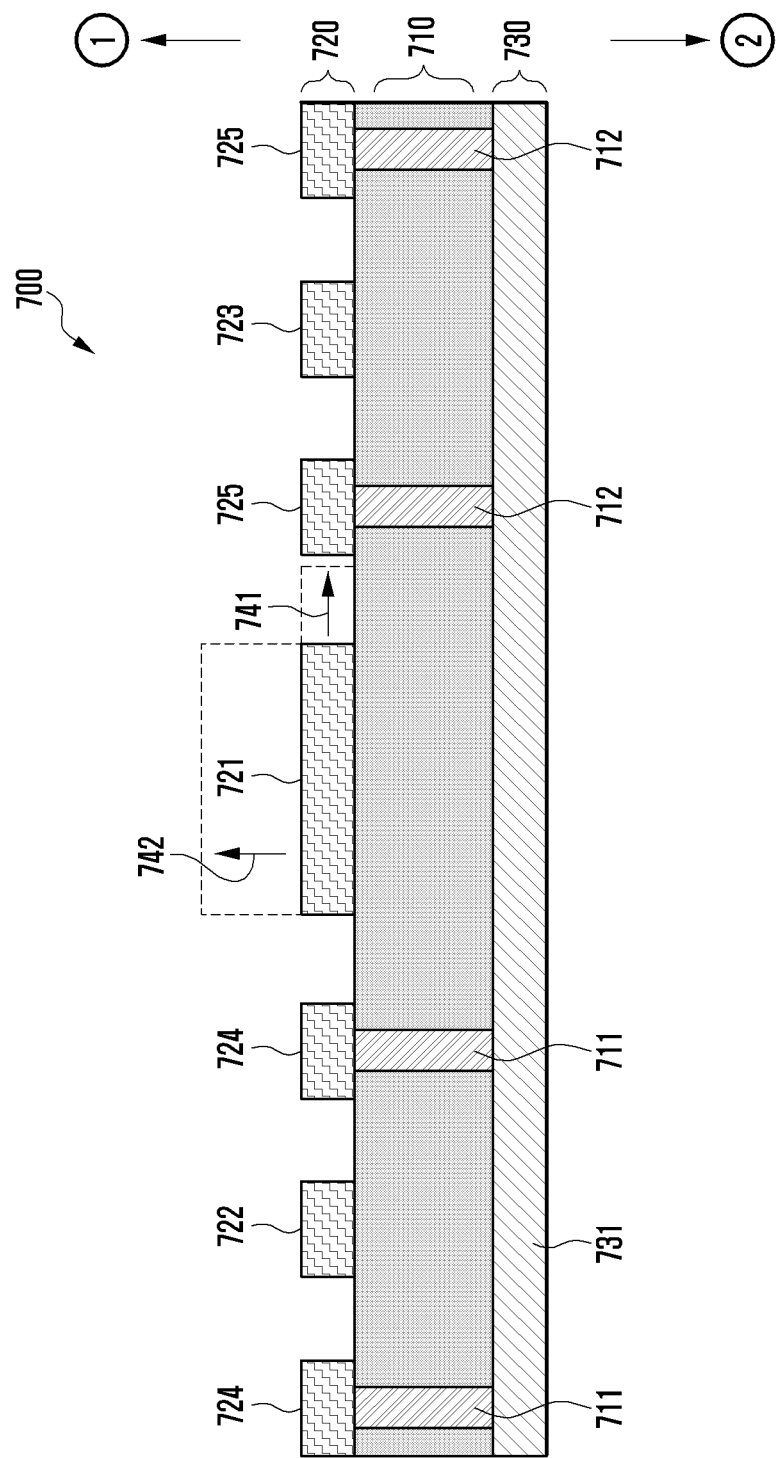
FIG. 7 is a cross-sectional view of a flexible circuit board according to a comparative example.

FIG. 7 is a cross-sectional view of a flexible circuit board 700 according to a comparative example.

Referring to FIG. 7, the flexible circuit board 700 according to an comparative example may include an insulating layer 710, an upper conductive layer 720 formed in the first direction ① from the insulating layer 710, and a lower conductive layer 730 formed in the second direction ② opposite to the first direction ① from the insulating layer 710.

According to the comparative example, the upper conductive layer 720 may include a power line 721, a first signal line 722, a second signal line 723, first ground patterns 724, and second ground patterns 725. In the comparative example, the power line 721 may be formed between the first signal line 722 and the second signal line 723. In the comparative example, the first ground patterns 724 may be formed on opposite sides of the first signal line 722, and second ground patterns 725 may be disposed on opposite sides of the second signal line 723. In the comparative example, the first ground patterns 724 and the lower conductive layer 730 may be electrically connected to each other via first vias 711 penetrating the insulating layer 710, and the second ground patterns 725 and the lower conductive layer 730 may be electrically connected to each other via second vias 712 penetrating the insulating layer 710.

According to the comparative example, since the power line 721, the first signal line 722, and the second signal line 723 are formed on the same layer, all of them may have the same thickness. In the flexible circuit board 410 according to the comparative example, the thickness of the upper conductive layer 720 may be designed to have a thickness designated for impedance matching of the first signal line 722 and the second signal line 723 (e.g., 50 ohm (Ω) impedance matching), and thus the thickness of the power line 721 may be designed in consideration of impedance matching of the first signal line 722 and the second signal line 723.

In the flexible circuit board 700 according to the comparative example, when the thickness of the upper conductive layer 720 including the power line is increased in order to reduce the resistance of the power line 721 as indicated by the arrow 742 in FIG. 7, impedance mismatching may occur in the first signal line 722 and the second signal line 723.

In the flexible circuit board 410 according to the comparative example, increasing the width of the power line 721 as indicated by the arrow 741 in FIG. 7 may increase the overall width of the flexible circuit board 410.

Meanwhile, in the flexible circuit board 410 according to an embodiment of the disclosure described with reference to FIG. 5 to and FIGS. 6A to 6D, since the layers in which the first signal line 5221 and the second signal line 5222 are formed (e.g., the second multiple layers 520) and the layers in which the power line 5121 is formed (e.g., the first multiple layers 510) are separated, it is easy to reduce the resistance of the power line 5121 by designing the power line 5121 to have a great thickness. For example, in the flexible circuit board 410 according to an embodiment of the disclosure, it is possible to reduce the resistance by designing the thickness of the power line 5121 to be greater than that of the power line according to the comparative example illustrated in FIG. 7 while maintaining impedance matching by maintaining the thickness of the first signal line 5221 and the second signal line 5222 to be the same as the thickness of the first signal 722 and the second signal line 723 according to the comparative example illustrated in FIG. 7.

Figure 8:
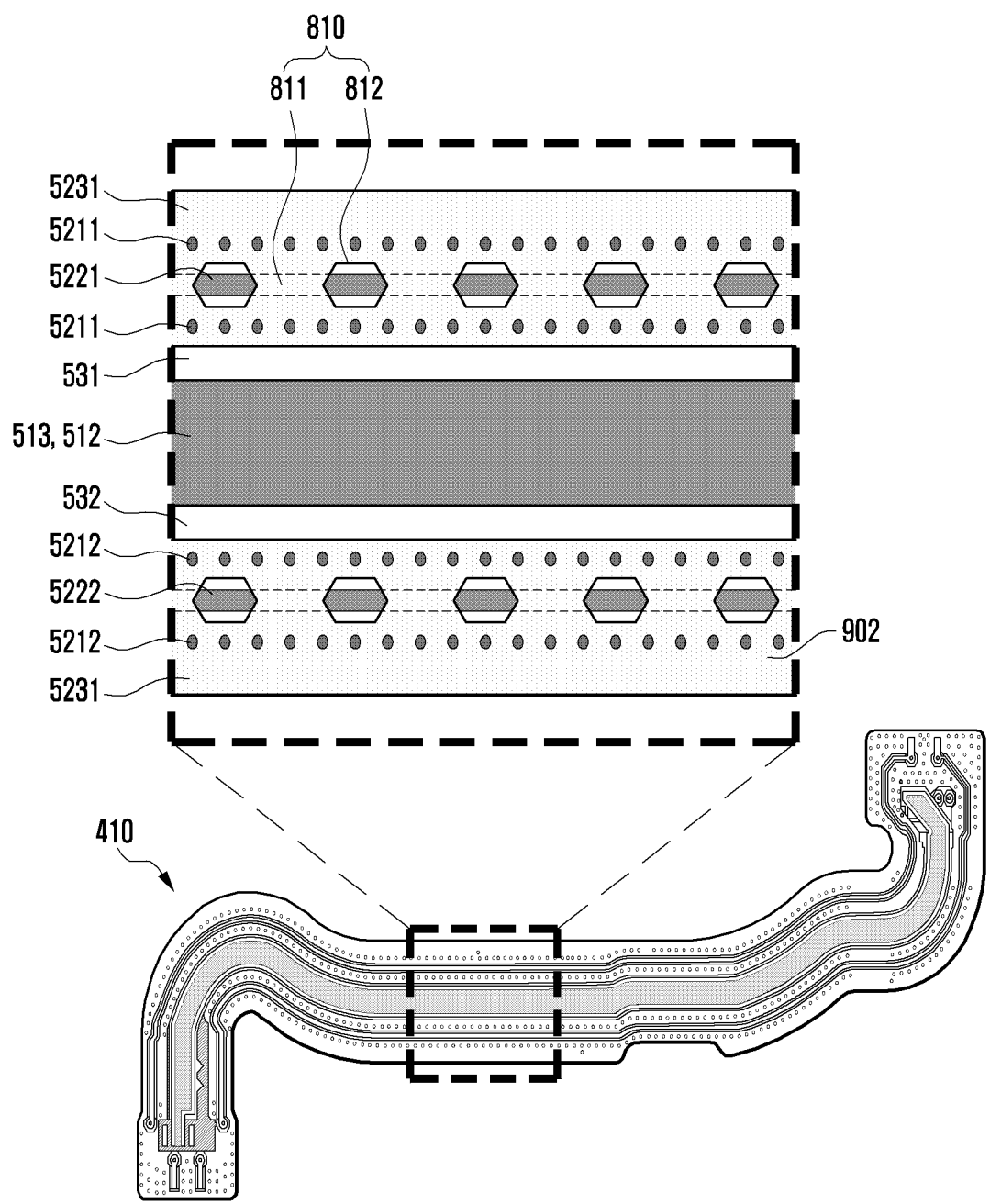
FIG. 8 is a diagram illustrating a rear surface of a flexible circuit board according to various embodiments.
Figure 9:
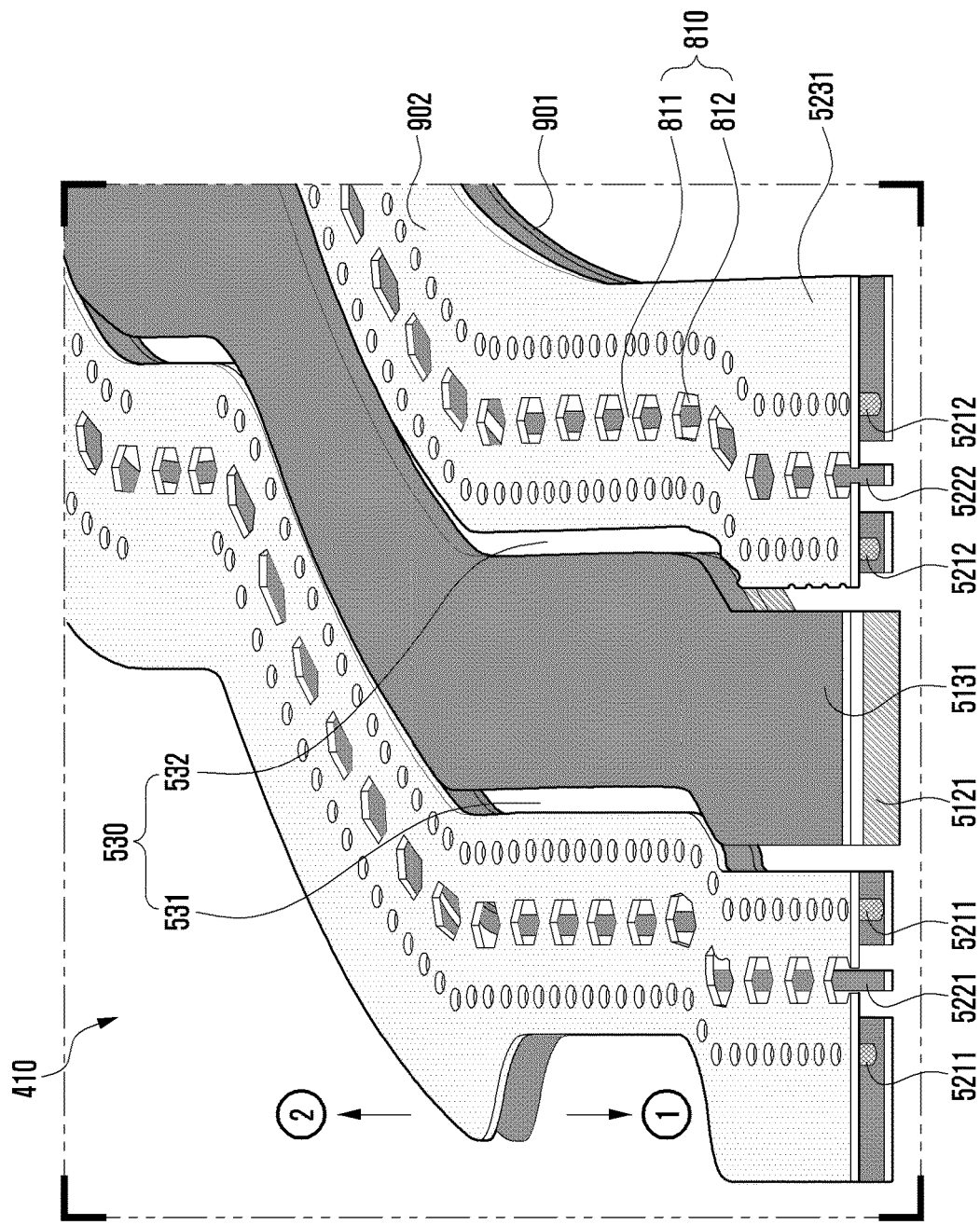
FIG. 9 is a perspective view illustrating a rear surface of a flexible circuit board according to various embodiments.

FIG. 8 is a diagram illustrating a rear surface of a flexible circuit board 410 according to various embodiments. FIG. 9 is a perspective view illustrating a rear surface of a flexible circuit board 410 according to various embodiments.

For example, FIGS. 8 and 9 include enlarged views of the rear surface of the first flexible circuit board 410 illustrated in FIG. 4 or FIG. 5 or a portion thereof. The flexible circuit board 410 illustrated in FIGS. 8 and 9 may be at least partially similar to or different from the first flexible circuit board 410 illustrated in FIG. 4 or the flexible circuit board 410 shown in FIG. 5, or may further include various embodiments.

Hereinafter, the portions not described with reference to FIGS. 4 and 5 will be described with reference to FIGS. 8 and 9.

Referring to FIGS. 8 and 9, the flexible circuit board 410 according to an embodiment of the disclosure may include a ground mesh structure 810 for impedance matching (e.g., 50 ohm (Ω) impedance matching) of the first signal line 5221 and the second signal line 5222.

According to an embodiment, the flexible circuit board 410 may include a first surface facing the first direction ① (e.g., the first surface 901 in FIG. 9) and a second surface opposite to the first surface 901 (e.g., the second surface 902 in FIGS. 8 and 9). The example illustrated in FIG. 8 may be a view of the second surface 902 of the flexible circuit board 410 viewed from above.

According to an embodiment, the flexible circuit board 410 may include first multiple layers (e.g., the first multiple layers 510 in FIG. 5) including the power line 5121, and second multiple layers (e.g., the second multiple layers 520 in FIG. 5) including the first signal line 5221 and the second signal line 5222.

According to an embodiment, the power line 5121 may be disposed between the first signal line 5221 and the second signal line 5222. According to an embodiment, a first slit 531 may be formed between the power line 5121 and the first signal line 5221, and a second slit 532 may be formed between the power line 5121 and the second signal line 5222. According to an embodiment, the first slit 531 and the second slit 532 are formed to penetrate both the first multiple layers 510 and the second multiple layers 520, and may be arranged in the direction in which the power line 5121 is formed.

For example, a plurality of first vias 5211 may be formed at intervals on opposite sides of the first signal line 5221. According to an embodiment, a plurality of second vias 5212 may be formed at intervals on opposite sides of the second signal line 5222.

According to an embodiment, the power line 5121 may be formed on the first upper conductive layer 512 of the first multiple layers 510, and a first lower conductive layer 513 may be formed in the second direction ② from the first upper conductive layer 512. For example, the first lower conductive layer 513 may be disposed to face the second surface of the flexible circuit board 410. According to an embodiment, the first lower conductive layer 513 may include a first lower ground 5131.

According to an embodiment, the first signal line 5221 and the second signal line 5222 may be formed on the second upper conductive layer (e.g., the second upper conductive layer 522 in FIG. 5) of the second multiple layers 520, and a second lower conductive layer (e.g., the second lower conductive layer 523 in FIG. 5) may be formed in the second direction ② from the second upper conductive layer 512. According to an embodiment, the second lower conductive layer 523 may include a second lower ground 5231.

According to an embodiment, the second lower ground 5231 may include a ground mesh structure 810 for impedance matching (e.g., 50 ohm (Ω) impedance matching) of the first signal line 5221 and the second signal line 5222.

According to an embodiment, the ground mesh structure 810 may include a plurality of openings 812 and a plurality of bridges 811 formed along a direction in which the first signal line 5221 and the second signal line 5222 are arranged.

According to an embodiment, the plurality of openings 812 may be regions in each of which a portion of the second conductive layer 523 is removed so that at least a portion of the first signal line 5221 or at least a portion of the second signal line 5222 is exposed. According to an embodiment, the plurality of openings 812 may be formed at intervals along the direction in which the first signal line 5221 and the second signal line 5222 are arranged.

According to an embodiment, the plurality of bridges 811 may be regions each of which crosses the first signal line 5221 or the second signal line 5222 between the plurality of openings 812. According to an embodiment, the plurality of bridges 811 may be formed at intervals along the direction in which the first signal line 5221 and the second signal line 5222 are arranged.

According to an embodiment, the openings 812 and the bridges 811 may be alternately formed. For example, a bridge 811 may be disposed between adjacent openings 812, and an opening 812 may be formed between adjacent bridges 811.

Figure 10:
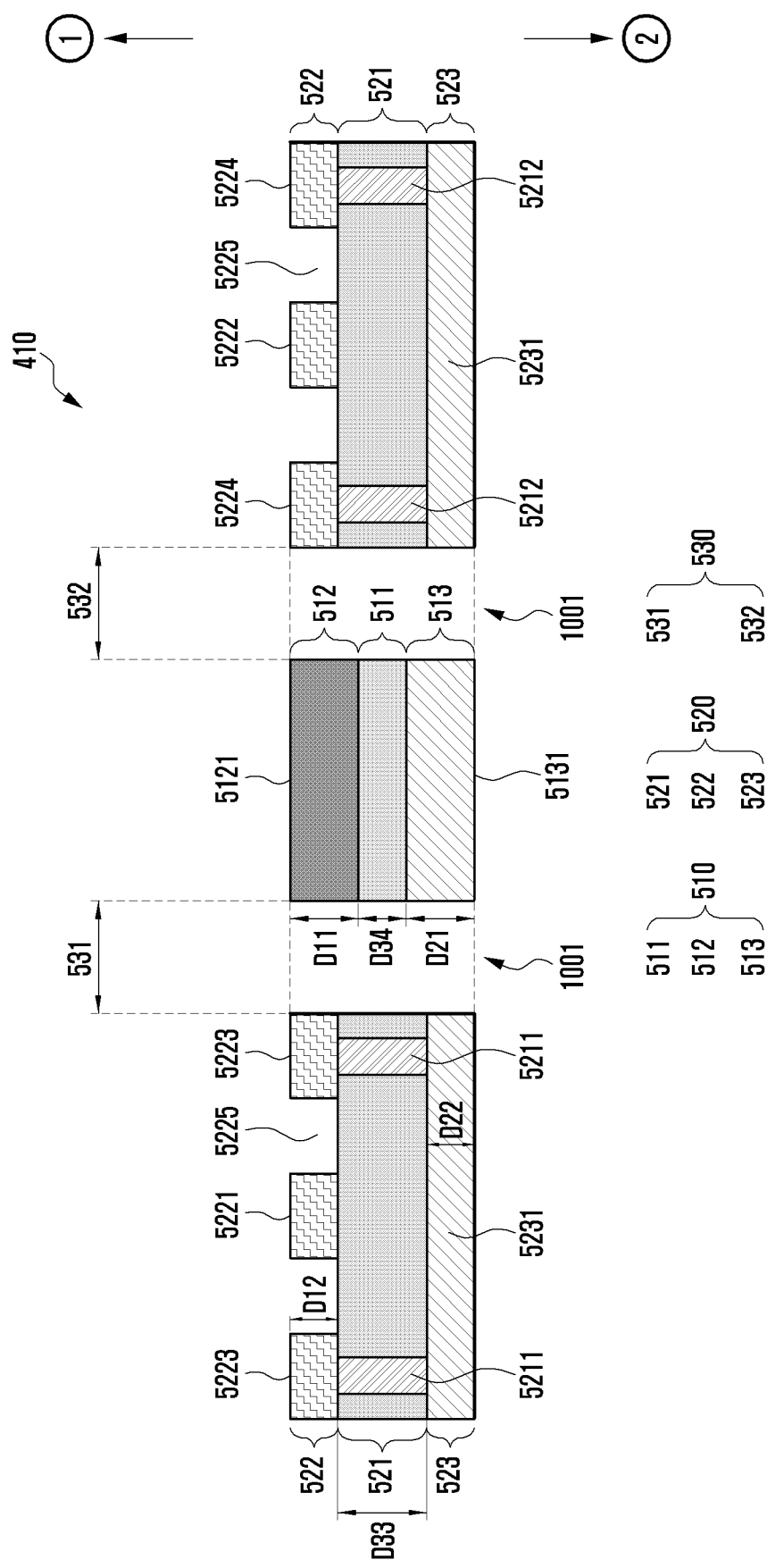
FIG. 10 is a cross-sectional view of a flexible circuit board according to various embodiments.

FIG. 10 is a cross-sectional view of a flexible circuit board 410 according to various embodiments.

The flexible circuit board 410 illustrated in FIG. 10 may be at least partially similar to or different from the first flexible circuit board 410 illustrated in FIG. 5, or may further include various embodiments.

Hereinafter, portions that have changed from the embodiment of FIG. 5 will be described with reference to FIG. 10. In FIG. 10, the same reference numerals are used for the same components as those of FIG. 5, and for the descriptions of the same reference numerals, the description made with reference to FIG. 5 will be used instead.

Referring to FIG. 10, in the flexible circuit board 410, as indicated by the arrow 1001 of FIG. 10, the thickness of the first multiple layers 510 and the thickness of the second multiple layers 520 may be made equal to each other by adjusting the thickness D34 of the first insulating layer 511.

According to an embodiment, in the flexible circuit board 410, the thickness D34 of the first insulating layer 511 may be smaller than the thickness D33 of the second insulating layer 521 so that the entire thickness of the first multiple layers 510 substantially equals the entire thickness of the second multiple layers 520.

According to an embodiment, the thickness D11 of the power line 5121 may be greater than the thickness D12 of the first signal line 5221 and the second signal line 5222, but the entire thickness of the first multiple layers 510 may substantially equal the entire thickness of the second multiple layers 520.

Figure 11:
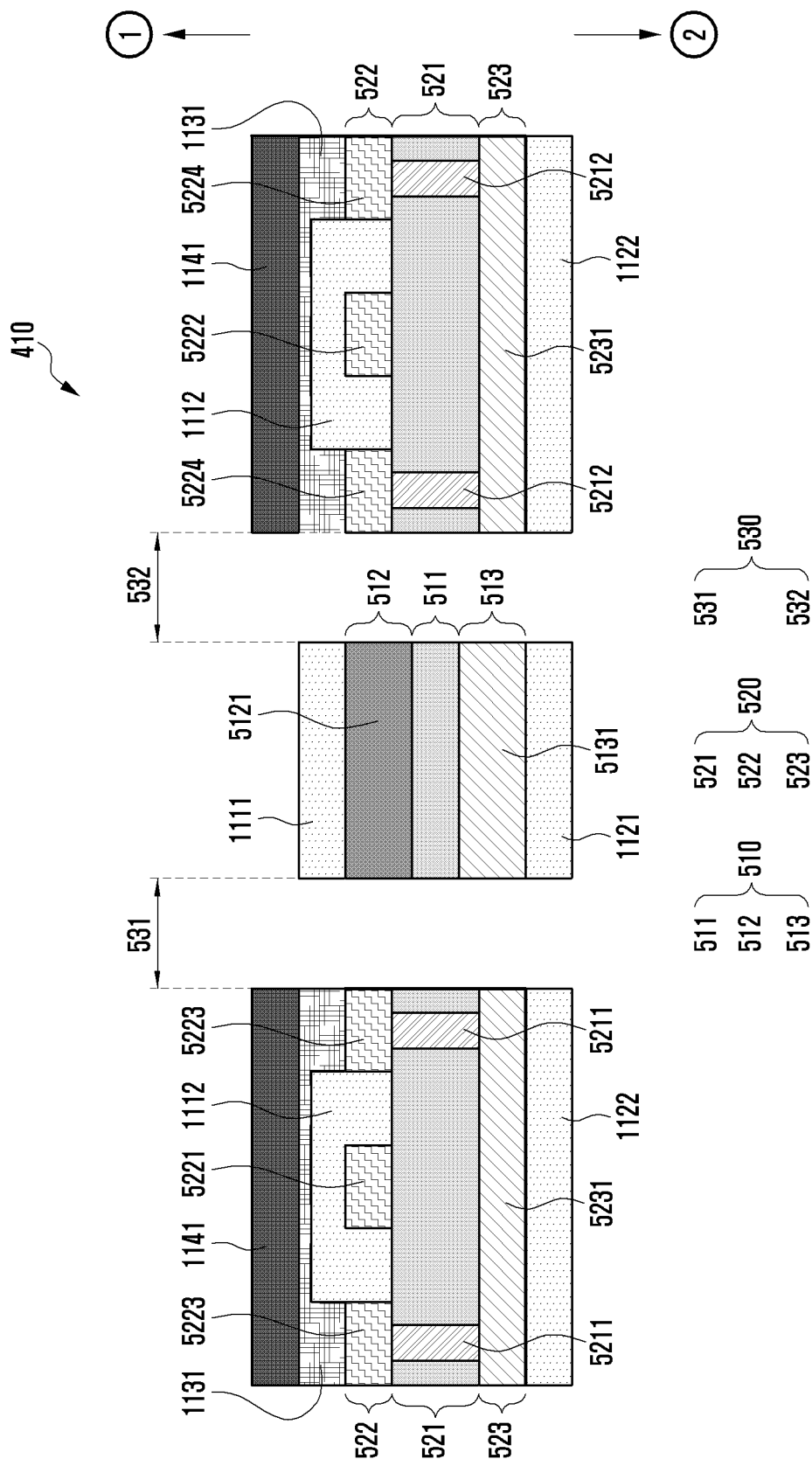
FIG. 11 is a cross-sectional view of a flexible circuit board according to various embodiments.

FIG. 11 is a cross-sectional view of a flexible circuit board 410 according to various embodiments. The flexible circuit board 410 illustrated in FIG. 11 may be at least partially similar to or different from the flexible circuit board 410 illustrated in FIG. 5, or may further include various embodiments.

Hereinafter, portions that have changed from the embodiment of FIG. 5 will be described with reference to FIG. 11. In FIG. 11, the same reference numerals are used for the same components as those of FIG. 5, and for the descriptions of the same reference numerals, the description made with reference to FIG. 5 will be used instead.

Referring to FIG. 11, the flexible circuit board 410 may further include cover layers 1111, 1112, 1121, and/or 1122 and a shield film 1141.

According to an embodiment, the first multiple layers 510 may further include cover layers 1111 and 1121. For example, in the first multiple layers 510, a first upper cover layer 1111 may be formed in the first direction ① from the first upper conductive layer 512, and a first lower cover layer 1121 may be formed in the second direction ② from the first lower conductive layer 513.

According to an embodiment, the second multiple layers 520 may further include cover layers 1112 and 1122. For example, in the second multiple layers 520, a second upper cover layer 1112 may be formed in the first direction ① from the second upper conductive layer 522, and a second lower cover layer 1111 may be formed in the second direction ② from the second lower conductive layer 523. According to an embodiment, the second upper cover layer 1112 may be formed to cover the first signal line 5221 and the second signal line 5222.

According to an embodiment, the second multiple layers 520 may further include a shield film 1141. For example, in the second multiple layers 520, a shield film 1141 may be further formed in the first direction ① from the second upper cover layer 1112. According to an embodiment, the shield film 1141 may be electrically connected to the first ground pattern 5223 or the second ground pattern 5224 via the conductive member 1131. According to an embodiment, the shield film may include an electromagnetic interference (EMI) film.

Figure 12:
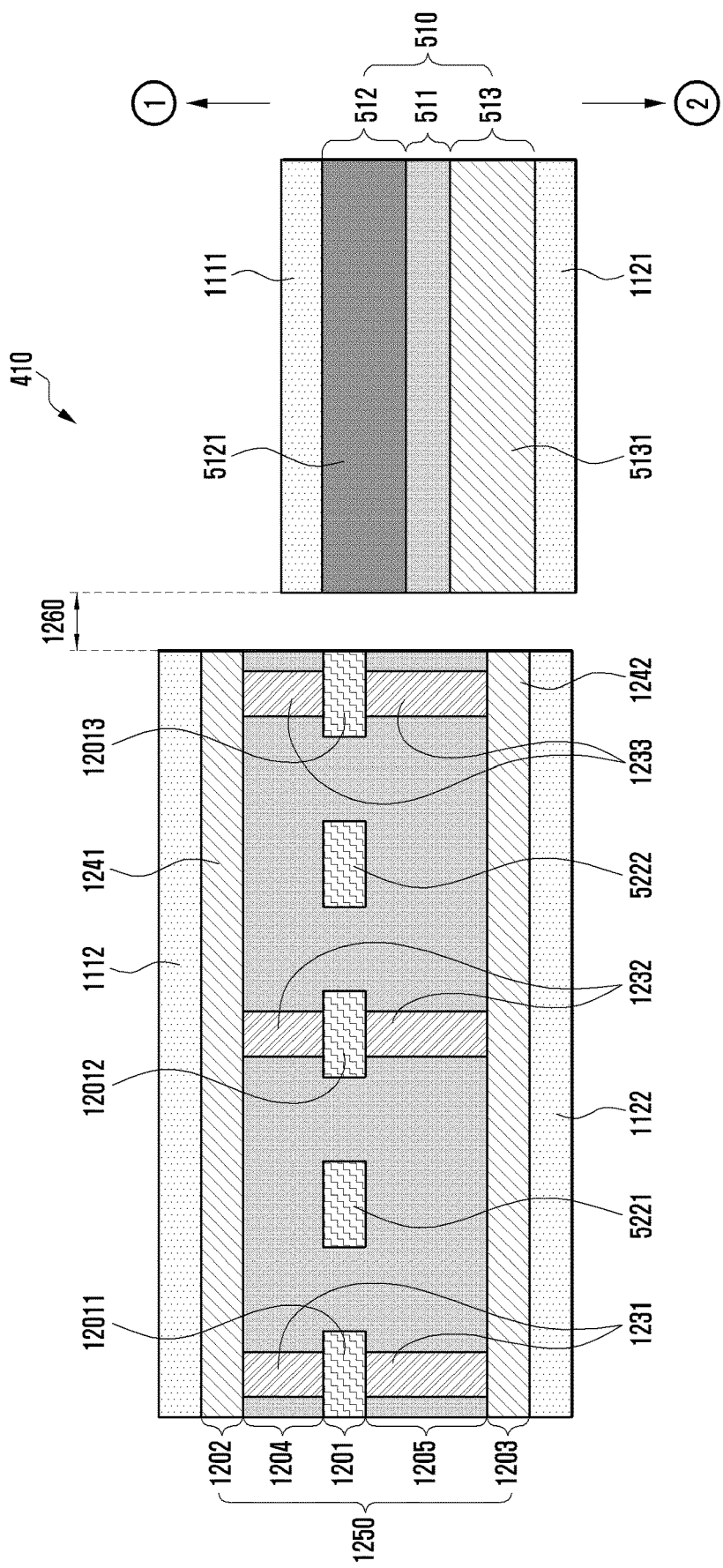
FIG. 12 is a cross-sectional view of a flexible circuit board according to various embodiments.

FIG. 12 is a cross-sectional view of a flexible circuit board 410 according to various embodiments.

The flexible circuit board 410 illustrated in FIG. 12 may be at least partially similar to or different from the flexible circuit board 410 illustrated in FIG. 5, or may further include various embodiments.

Hereinafter, portions that have changed from the embodiment of FIG. 5 will be described with reference to FIG. 12. In FIG. 12, the same reference numerals are used for the same components as those of FIG. 5, and for the descriptions of the same reference numerals, the description made with reference to FIG. 5 will be used instead.

Referring to FIG. 12, in the flexible circuit board 410, the first signal line 5221 and the second signal line 5222 may be disposed adjacent to each other, and the power line 5121 may be disposed through the slit 1260 so as to be spaced apart from the first signal line 5221 and the second signal line 5222.

According to an embodiment, the flexible circuit board 410 may include first multiple layers 510 including the power line 5121, and second multiple layers 1250 including the first signal line 5221 and the second signal line 5222.

According to an embodiment, slits 1260 may be formed between the first signal line 5221 and the second signal line 5222 and the power line 5121. For example, a slit 1260 may be disposed between the first multiple layers 510 and the second multiple layers 1250. According to an embodiment, the slit 1260 may be formed through a punching process that is the same as or similar to the punching process as described with reference to FIG. 6C.

According to an embodiment, the first multiple layers 510 may include a first upper conductive layer 1202 including a power line 5121, a first insulating layer 511, and a first lower conductive layer 1203. According to an embodiment, a first upper cover layer 1111 may be formed in the first direction ① from the first upper conductive layer 1202, and a first lower cover layer 1121 may be formed in the second direction ② from the first lower conductive layer 1203.

According to an embodiment, the second multiple layers 1250 may include a first intermediate conductive layer 1201 on which the first signal line 5221 and the second signal line 5222 are formed, a second upper conductive layer 1202 formed in the first direction ① from the intermediate conductive layer 1201 and electrically connected to a ground, and a second lower conductive layer 1203 formed in the second direction ② opposite to the first direction ① from the intermediate conductive layer 1201 and electrically connected to a ground.

According to an embodiment, the intermediate conductive layer 1201 may further include a first ground pattern 12011 formed in a third direction (e.g., the left direction in FIG. 12) from the first signal line 5221, a second ground pattern 12012 formed in a fourth direction (e.g., the right direction in FIG. 12) opposite to the third direction from the first signal line 5221, and a third ground pattern 12013 formed in a fourth direction from the second signal line 5222. According to an embodiment, the second ground pattern 12012 may be disposed between the first signal line 5221 and the second signal line 5222. According to an embodiment, the third and fourth directions may be perpendicular to the first direction ① or the second direction ②.

According to an embodiment, the second multiple layers 1250 may further include a first intermediate insulating layer 1204 formed between the intermediate conductive layer 1201 and the second upper conductive layer 1202, and the second intermediate insulating layer 1205 formed between the intermediate conductive layer 1201 and the second lower conductive layer 1203.

According to an embodiment, the second multiple layers 1250 may further include a second upper cover layer 1112 formed in the first direction ① from the second upper conductive layer 1202, and a second lower cover layer 1122 formed in the second direction ② from the second lower conductive layer 1203.

According to an embodiment, the second multiple layers 1250 may further include a plurality of vias 1231, 1232, and 1233 penetrating the first intermediate insulating layer 1204 and the second intermediate insulating layer 1205 and electrically connecting the second upper conductive layer 1202 and the second lower conductive layer 1203 to each other. According to an embodiment, the plurality of vias 1231, 1232, and 1233 may include a first via 1231 formed in the third direction (e.g., the left direction in FIG. 12) from the first signal line 5221, a second via 1232 formed in the fourth direction opposite to the third direction from the first signal line 5221, and a third via 1233 formed in the fourth direction from the second signal line 5222. According to an embodiment, the second via 1232 may be disposed between the first signal line 5221 and the second signal line 5222.

Figure 13:
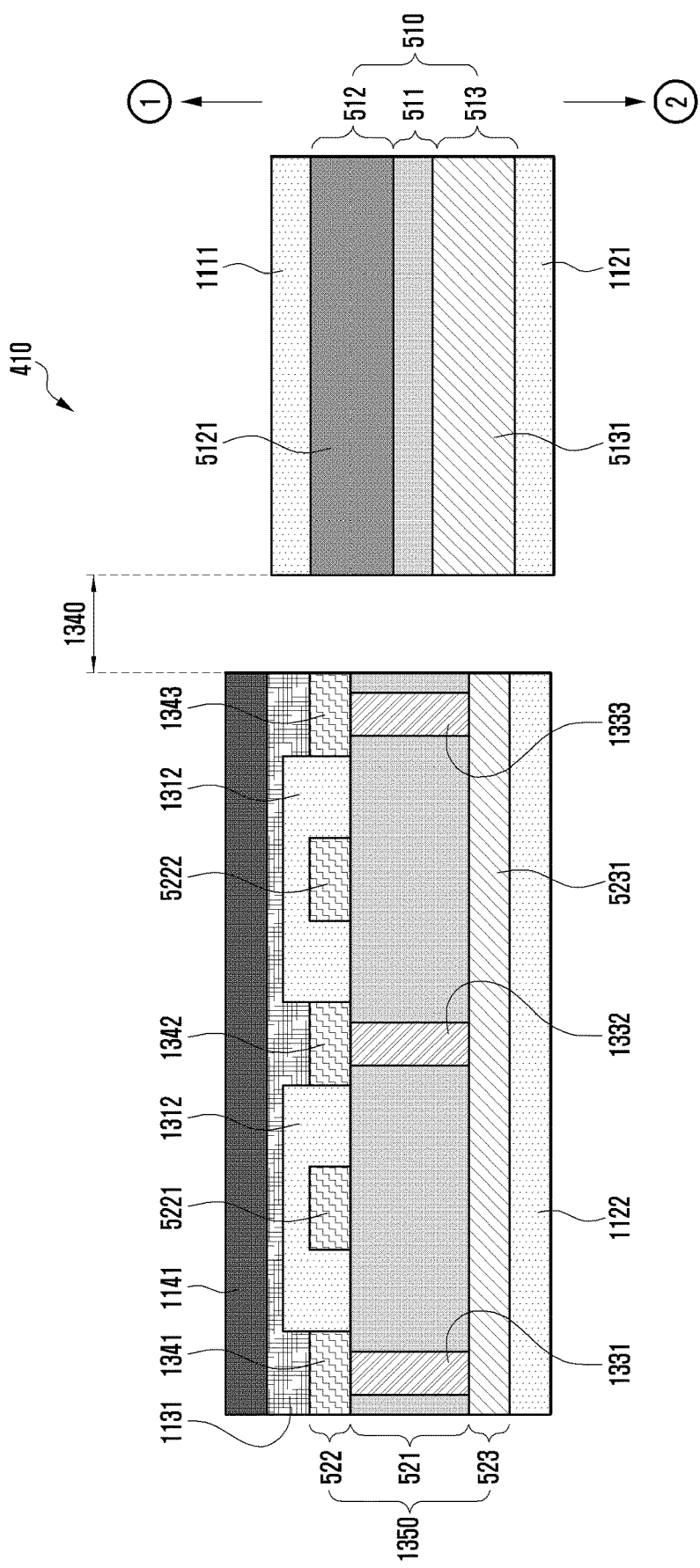
FIG. 13 is a cross-sectional view of a flexible circuit board according to various embodiments.

FIG. 13 is a cross-sectional view of a flexible circuit board 410 according to various embodiments.

The flexible circuit board 410 illustrated in FIG. 13 may be at least partially similar to or different from the first flexible circuit board 410 illustrated in FIG. 5, or may further include various embodiments.

Hereinafter, portions that have changed from the embodiment of FIG. 5 will be described with reference to FIG. 13. In FIG. 13, the same reference numerals are used for the same components as those of FIG. 5, and for the descriptions of the same reference numerals, the description made with reference to FIG. 5 will be used instead.

Referring to FIG. 13, in the flexible circuit board 410, the first signal line 5221 and the second signal line 5222 may be disposed adjacent to each other, and the power line 5121 may be disposed through the slit so as to be spaced apart from the first signal line 5221 and the second signal line 5222.

According to an embodiment, the flexible circuit board 410 may include first multiple layers 510 including the power line 5121, and second multiple layers 1350 including the first signal line 5221 and the second signal line 5222.

According to an embodiment, slits 1340 may be formed between the first signal line 5221 and the second signal line 5222 and the power line 5121. For example, a slit 1340 may be disposed between the first multiple layers 510 and the second multiple layers 1350. According to an embodiment, the slit 1340 may be formed through a punching process that is the same as or similar to the punching process as described with reference to FIG. 6C.

According to an embodiment, the first multiple layers 510 may include a first upper conductive layer 512 including a power line 5121, a first insulating layer 511, and a first lower conductive layer 513. According to an embodiment, a first upper cover layer 1111 may be formed in the first direction ① from the first upper conductive layer 512, and a first lower cover layer 1211 may be formed in the second direction ② from the first lower conductive layer 513.

According to an embodiment, the second multiple layers 1350 may include a second upper conductive layer 522 on which the first signal line 5221 and the second signal line 5222 are formed, a second insulating layer 521, and a second lower conductive layer 523.

According to an embodiment, the second upper conductive layer 522 may further include a first ground pattern 1341 formed in a third direction (e.g., the left direction in FIG. 13) from the first signal line 5221, a second ground pattern 1342 formed in a fourth direction (e.g., the right direction in FIG. 13) opposite to the third direction from the first signal line 5221, and a third ground pattern 1343 formed in a fourth direction from the second signal line 5222. According to an embodiment, the second ground pattern 1342 may be disposed between the first signal line 5221 and the second signal line 5222. According to an embodiment, the third and fourth directions may be perpendicular to the first direction ① or the second direction ②.

According to an embodiment, the second multiple layers 1350 may further include a second upper cover layer 1312 formed in the first direction ① from the second upper conductive layer 522, and a second lower cover layer 1122 formed in the second direction ② from the second lower conductive layer 523.

According to an embodiment, the second multiple layers 1350 may further include a plurality of vias 1331, 1332, and 1333 penetrating the second insulating layer 521 and electrically connecting the second upper conductive layer 522 and the second lower conductive layer 523 to each other. According to an embodiment, the plurality of vias 1331, 1332, and 1333 may include a first via 1331 formed in the third direction (e.g., the left direction in FIG. 12) from the first signal line 5221, a second via 1332 formed in the fourth direction opposite to the third direction from the first signal line 5221, and a third via 1333 formed in the fourth direction from the second signal line 5222. According to an embodiment, the second via 1332 may be disposed between the first signal line 5221 and the second signal line 5222.

With the flexible circuit board 410 according to various embodiments, it is possible to increase the thickness of the power line (e.g., 5121 in FIG. 5) while maintaining impedance matching of the signal lines (e.g., 5221 and 5222 in FIG. 5), thereby enabling high power transmission.

With the flexible circuit board 410 according to various embodiments, it is possible to facilitate a design for low heat generation due to a decrease in DC resistance of the power line 5121.

With the flexible circuit board 410 according to various embodiments, it is possible to design the signal lines (e.g., the first signal line 5221 and the second signal line 5222 in FIG. 5) and the power line 5121 to have different thicknesses. Therefore, it is easy to reduce the thickness of the signal lines 5221 and 5222, and it is possible to manufacture the flexible circuit board 410 in a thin shape.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

The invention claimed is:

1. An electronic device comprising:
   a flexible circuit board configured to transmit a signal in a high-frequency band,
   wherein the flexible circuit board includes: first multiple layers including a power line configured to transmit power, and second multiple layers stacked in a first direction of the first multiple layers and including a first signal line and a second signal line configured to transmit a signal in the high-frequency band,
   the first multiple layers including a first punched region in which at least a portion overlapping the first signal line and the second signal line is removed,
   the second multiple layers including a second punched region in which at least a portion overlapping the power line is removed, and
   at least a portion of the second punched region and the first punched region overlap each other forming a slit penetrating the flexible circuit board in the first direction.

2. The electronic device of claim 1, wherein the first multiple layers include:
   a first insulating layer;
   a first upper conductive layer disposed in the first direction from the first insulating layer and including the power line; and
   a first lower conductive layer disposed in a second direction opposite the first direction from the first insulating layer and including a first lower ground.

3. The electronic device of claim 2, wherein the second multiple layers include:
   a second insulating layer;
   a second upper conductive layer disposed in the first direction from the second insulating layer and including the first signal line and the second signal line; and
   a second lower conductive layer disposed in the second direction from the second insulating layer and including a second lower ground.

4. The electronic device of claim 3, wherein a thickness of the first upper conductive layer is greater than a thickness of the second upper conductive layer such that a thickness of the power line is greater than the thicknesses of the first signal line and the second signal line.

5. The electronic device of claim 3, wherein a thickness of the first lower conductive layer including the first lower ground is greater than a thickness of the second lower conductive layer including the second lower ground.

6. The electronic device of claim 3, wherein a thickness of the first insulating layer is less than a thickness of the second insulating layer such that an entire thickness of the first multiple layers is equal to an entire thickness of the second multiple layers.

7. The electronic device of claim 3, wherein the second upper conductive layer further includes:
   a plurality of first ground patterns provided at intervals on opposite sides of the first signal line, and
   a plurality of second ground patterns provided at intervals on opposite sides of the second signal line.

8. The electronic device of claim 7, wherein the second multiple layers further include:
   a plurality of first vias penetrating the second insulating layer and electrically connecting the plurality of first ground patterns and the second lower ground; and
   a plurality of second vias penetrating the second insulating layer and electrically connecting the plurality of second ground patterns and the second lower ground.

9. The electronic device of claim 7, wherein the second multiple layers further include:
   a cover layer disposed in the first direction from the second upper conductive layer and covering the first signal line and the second signal line; and
   a shield film disposed in the first direction from the cover layer and electrically connected to the plurality of first ground patterns and the plurality of second ground patterns by the conductive member.

10. The electronic device of claim 1, wherein the flexible circuit board includes a first surface facing the first direction and a second surface facing away from the first surface, and
    the slit is provided between the power line and the first signal line and/or between the power line and the second signal line when the first surface is viewed from above.

11. The electronic device of claim 10, wherein the power line is disposed between the first signal line and the second signal line when the first surface is viewed from above.

12. The electronic device of claim 10, wherein the second signal line is disposed between the first signal line and the power line when the first surface is viewed from above.

13. A flexible circuit board configured to transmit a signal in a high-frequency band, the flexible circuit board comprising:
    first multiple layers including a power line configured to transmit power; and
    second multiple layers stacked in a first direction of the first multiple layers and including a first signal line and a second signal line configured to transmit a signal in the high-frequency band,
    wherein the first multiple layers include a first punched region in which at least a portion overlapping the first signal line and the second signal line is removed,
    the second multiple layers include a second punched region in which at least a portion overlapping the power line is removed, and
    at least a portion of the second punched region and the first punched region overlap each other to provide a slit penetrating the flexible circuit board in the first direction.

14. The flexible circuit board of claim 13, wherein the first multiple layers include:
    a first insulating layer;
    a first upper conductive layer disposed in the first direction from the first insulating layer and including the power line; and
    a first lower conductive layer disposed in a second direction opposite the first direction from the first insulating layer and including a first lower ground.

15. The flexible circuit board of claim 14, wherein the second multiple layers include:
    a second insulating layer;
    a second upper conductive layer disposed in the first direction from the second insulating layer and including the first signal line and the second signal line; and
    a second lower conductive layer disposed in the second direction from the second insulating layer and including a second lower ground.

* * * * *